United States Patent
Tseng et al.

(10) Patent No.: US 7,596,728 B2
(45) Date of Patent: Sep. 29, 2009

(54) BUILT-IN SELF REPAIR CIRCUIT FOR A MULTI-PORT MEMORY AND METHOD THEREOF

(75) Inventors: Tsu-Wei Tseng, Taipei (TW); Yu-Jen Huang, Kaohsiung (TW); Chun-Hsien Wu, Hsinchu (TW); Jin-Fu Li, Pingtung County (TW); Chien-Yuan Pao, Taipei (TW)

(73) Assignee: Faraday Technology Corp., Hsin-Chu (TW)

( * ) Notice: Subject to any disclaimer, the term of this patent is extended or adjusted under 35 U.S.C. 154(b) by 225 days.

(21) Appl. No.: 11/870,169

(22) Filed: Oct. 10, 2007

(65) Prior Publication Data
US 2009/0097342 A1    Apr. 16, 2009

(51) Int. Cl.
G11C 29/00 (2006.01)
G01R 31/28 (2006.01)

(52) U.S. Cl. .................. 714/710; 714/733; 365/201
(58) Field of Classification Search .............. None
See application file for complete search history.

(56) References Cited

U.S. PATENT DOCUMENTS

| | | | |
|---|---|---|---|
| 5,410,670 A * | 4/1995 | Hansen et al. | 711/169 |
| 6,240,525 B1 * | 5/2001 | Chiang | 714/8 |
| 6,550,032 B1 | 4/2003 | Zhao et al. | |
| 7,139,204 B1 * | 11/2006 | Behera | 365/201 |
| 7,308,604 B2 * | 12/2007 | McDonnell et al. | 714/9 |

* cited by examiner

*Primary Examiner*—Christine T Tu
(74) *Attorney, Agent, or Firm*—Winston Hsu

(57) ABSTRACT

A built-in self repair (BISR) circuit for a multi-port memory and a method thereof are provided. The circuit includes a test-and-analysis module (TAM) and a defect locating module (DLM) coupled to the TAM. The TAM tests a repairable multi-port memory to generate a fault location and determines whether the test generates a port-specific fault candidate according to the fault location. If a port-specific fault candidate is generated, the DLM generates a defect location based on the fault location and provides the defect location to the TAM so that the TAM can determine how to repair the repairable multi-port memory according to the defect location. If no port-specific fault candidate is generated in the test, the TAM determines how to repair the repairable multi-port memory according to the fault location.

20 Claims, 28 Drawing Sheets

| Short Circuit Defect Between Word Lines | Row Addresses to be Repaired |
|---|---|
| $WL_{B0}$-$WL_{A1}$ | Addr, Addr+1 |
| $WL_{A0}$-$WL_{B1}$ | |
| $WL_{A0}$-$WL_{A1}$ | |
| $WL_{B0}$-$WL_{B1}$ | |
| $WL_{A0}$-$WL_{B0}$ | Addr |
| $WL_{A1}$-$WL_{B1}$ | Addr+1 |

FIG.5B

| Short Circuit Defect Between Bit Lines | Column Addresses to be Repaired |
|---|---|
| $BL_{A0}$-$BL_{A1}$ | Addr, Addr+1 |
| $BL_{A0}$-$BL_{B1}$ | |
| $BL_{B0}$-$BL_{A1}$ | |
| $BL_{B0}$-$BL_{B1}$ | |
| $\overline{BL_{A0}}$-$\overline{BL_{A1}}$ | |
| $\overline{BL_{A0}}$-$\overline{BL_{B1}}$ | |
| $\overline{BL_{B0}}$-$\overline{BL_{A1}}$ | |
| $\overline{BL_{B0}}$-$\overline{BL_{B1}}$ | |
| $BL_{A0}$-$\overline{BL_{A1}}$ | |
| $BL_{A0}$-$\overline{BL_{B1}}$ | |
| $BL_{B0}$-$\overline{BL_{A1}}$ | |
| $BL_{B0}$-$\overline{BL_{B1}}$ | |
| $\overline{BL_{A0}}$-$BL_{A1}$ | |
| $\overline{BL_{A0}}$-$BL_{B1}$ | |
| $\overline{BL_{B0}}$-$BL_{A1}$ | |
| $\overline{BL_{B0}}$-$BL_{B1}$ | |

FIG.11B

BUILT-IN SELF REPAIR CIRCUIT FOR A MULTI-PORT MEMORY AND METHOD THEREOF

BACKGROUND OF THE INVENTION

1. Field of the Invention

The present invention generally relates to a built-in self repair (BISR) circuit for a memory and a method thereof, in particular, to a BISR circuit for a multi-port memory and a method thereof.

2. Description of Related Art

When an on-chip circuit contains multiple memories, testing of these memories will become a big problem. All the input and output terminals of the memories have to be connected out of the chip if an external device is used for testing the memories, such an enormous circuit layout not only takes up a lot of chip surface and increases the complexity of the circuit layout but is unrealistic with only limited number of chip pins. Thus, a concept of built-in self test (BIST) is provided, which is to fabricate a testing circuit and the memories to be tested on the same chip so that the input and output terminals of the memories do not have to be connected out of the chip for merely testing purpose. A built-in self repair (BISR) technique has been developed based on the BIST technique after repairable memory was invented.

FIG. 1 illustrates a conventional BISR circuit for a memory. A self tester 102 tests a repairable memory 101. If a fault occurs, the self tester 102 sends the location of the fault to a redundancy element analyzer 103, and the redundancy element analyzer 103 then analyzes the fault information detected by the self tester 102 and sends an optimal repair plan to the repairable memory 101. The repairable memory 101 then repairs the faulty column or row with a built-in redundancy element (i.e. a redundancy column and/or a redundancy row) according to this optimal repair plan.

According to the conventional BISR technique, a faulty column or row is repaired straightaway once the fault is detected in a memory, regardless of single-port or multi-port memory. This is feasible to a single-port memory for the detected fault location in the single-port memory is the actual defect location. However, as to a multi-port memory, the detected fault location may not be the actual defect location if a port-specific fault is generated during the test of the self tester 102, as illustrated in FIG. 2.

FIG. 2 illustrates three memory cells Cell0~Cell2 and related word lines and bit lines in a multi-port memory. Referring to FIG. 2, the multi-port memory has two ports which are respectively port A and port B. The column addresses of the memory cells Cell0~Cell2 are all 0, and the row addresses thereof are respectively 0~2. The bit value stored in Cell0 and Cell1 is 1, and the bit value stored in Cell2 is 0. ABL0 is a bit line corresponding to port A, and BBL0 is a bit line corresponding to port B. AWL0 is a word line corresponding to port A and row address Addr0, BWL0 is a word line corresponding to port B and row address Addr0, AWL1 is a word line corresponding to port A and row address Addr1, and so on. As shown in FIG. 2, a short circuit defect exists between the word lines AWL1 and BWL2.

When a testing program reads port B at row address Addr0 and port A at row address Addr1 at the same time, the word lines BWL0 and AWL1 are both enabled, and meanwhile, the word line BWL2 is also enabled due to the short circuit defect between the word lines AWL1 and BWL2. Thus, the data stored in Cell1 is output to the bit line ABL0, and the data stored in Cell0 and Cell2 are output to the bit line BBL0 at the same time. Since two different values are output to the bit line BBL0 at the same time, the value read from port B at row address Addr0 is faulty. However, the actual defect is not located at the row address Addr0 detected by the testing program but at row addresses Addr1 and Addr2.

In this case, the actual defect cannot be repaired by repairing the faulty row, and it will also be a waste of the redundancy element and cause a yield loss.

On the other hand, the situation described above will not happen to short circuit defect between bit lines, namely, the correct location of a short circuit defect between bit lines can be detected through a general testing algorithm. A testing algorithm is intended for obtaining the maximum coverage of a defect model with the least testing actions. Accordingly, even though a general testing algorithm can provide correct defect locations, the defect locations may not be complete. For example, if there is a short circuit defect between the bit lines of two bits, a testing algorithm may detect only one defective bit instead of two. In this case, only a portion of all defects are repaired if the defects are repaired according to such a testing result.

Accordingly, a general testing algorithm provides incorrect location information of defects between word lines and insufficient location information of defects between bit lines. In conclusion, a reliable BISR technique for repairing port-specific faults in a multi-port memory is required.

SUMMARY OF THE INVENTION

Accordingly, the present invention is directed to a built-in self repair (BISR) circuit for a multi-port memory, wherein accurate and complete defect locations are provided based on fault locations detected by the BISR circuit so that incorrect or incomplete repairs to the multi-port memory can be avoided.

The present invention is directed to a BISR method for a multi-port memory, wherein accurate and complete defect locations in the multi-port memory are provided so that inaccurate or incomplete repairs to the multi-port memory and waste of redundancy element are avoided and accordingly the production yield is improved.

The present invention provides a BISR circuit for a multi-port memory. The BISR circuit includes a test-and-analysis module (TAM) and a defect locating module (DLM) coupled to the TAM. The TAM tests a repairable multi-port memory to generate a fault location and determines whether the test generates a port-specific fault candidate according to the fault location. If a port-specific fault candidate is generated, the DLM generates a defect location based on the fault location and provides the defect location to the TAM, and the TAM then determines how to repair the repairable multi-port memory according to the defect location. If no port-specific fault candidate is generated in the test, the TAM determines how to repair the repairable multi-port memory according to the fault location.

According to an embodiment of the present invention, the repairable multi-port memory is in sub-array configuration.

According to an embodiment of the present invention, if the fault location includes a plurality of continuous memory cells in the same row, the TAM determines that the test generates a port-specific fault candidate corresponding to a word line defect and stores the row address of foregoing memory cells into the DLM as a fault row address. On the other hand, if the fault location includes a plurality of continuous memory cells in the same column, the TAM determines that the test generates a port-specific fault candidate corresponding to a bit line defect and stores the column address of foregoing memory cells into the DLM as a fault column address. The fault column address and the fault row address are used in a locating process executed by the DLM.

The present invention further provides a BISR method for a multi-port memory. The BISR method includes following steps. First, a repairable multi-port memory is tested to generate a fault location, and then whether the test generates a port-specific fault candidate is determined according to the fault location. If a port-specific fault candidate is generated in the test, a defect location is generated based on the fault location, and how to repair the repairable multi-port memory is determined according to the defect location. If no port-specific fault candidate is generated in the test, how to repair the repairable multi-port memory is determined according to the fault location.

In the present invention, defects which cause port-specific faults are categorized and a specific locating process is executed corresponding to each defect category, and the corresponding defect location can be obtained based on the fault generated in the locating process. Accordingly, in the present invention, accurate and complete defect locations can be provided based on seeming fault locations so that inaccurate or incomplete repairs to a multi-port memory can be avoided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A and 5B illustrate various short circuit defects between word lines according to an embodiment of the present invention.

FIGS. 11A and 11B illustrate various short circuit defects between bit lines according to an embodiment of the present invention.

DESCRIPTION OF THE EMBODIMENTS

Figure 1:
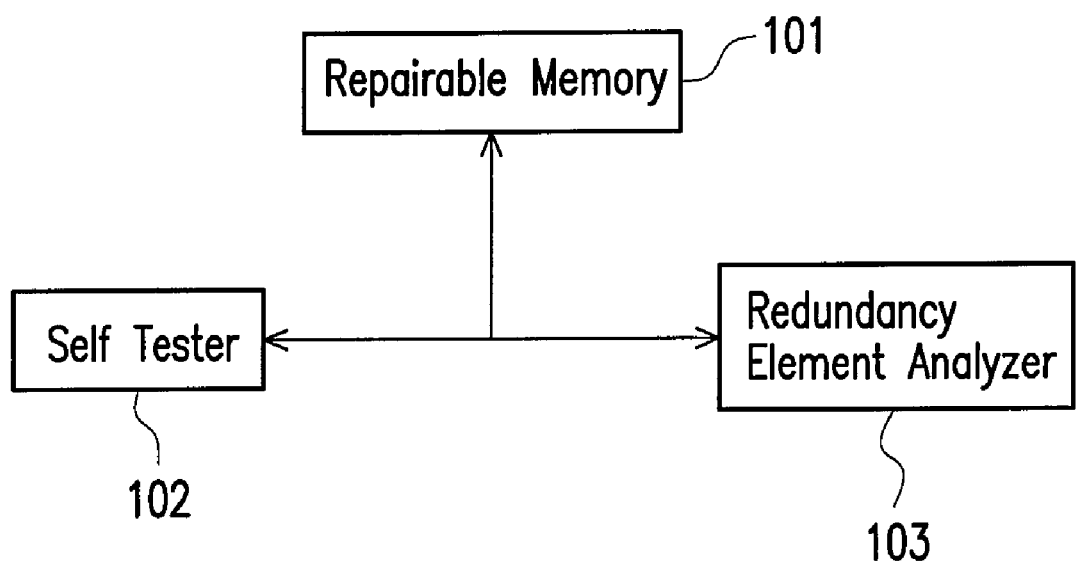
FIG. 1 is a diagram of a conventional built-in self repair (BISR) circuit for a memory.
Figure 2:
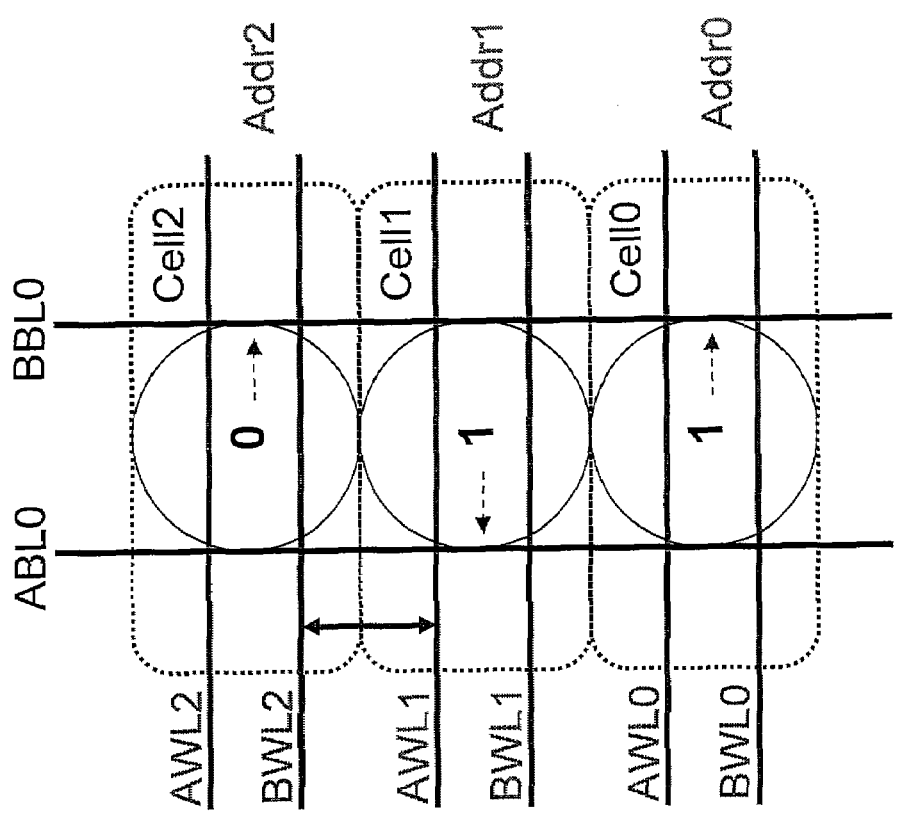
FIG. 2 illustrates a defect in a multi-port memory.

Reference will now be made in detail to the present preferred embodiments of the invention, examples of which are illustrated in the accompanying drawings. Wherever possible, the same reference numbers are used in the drawings and the description to refer to the same or like parts.

Figure 3:
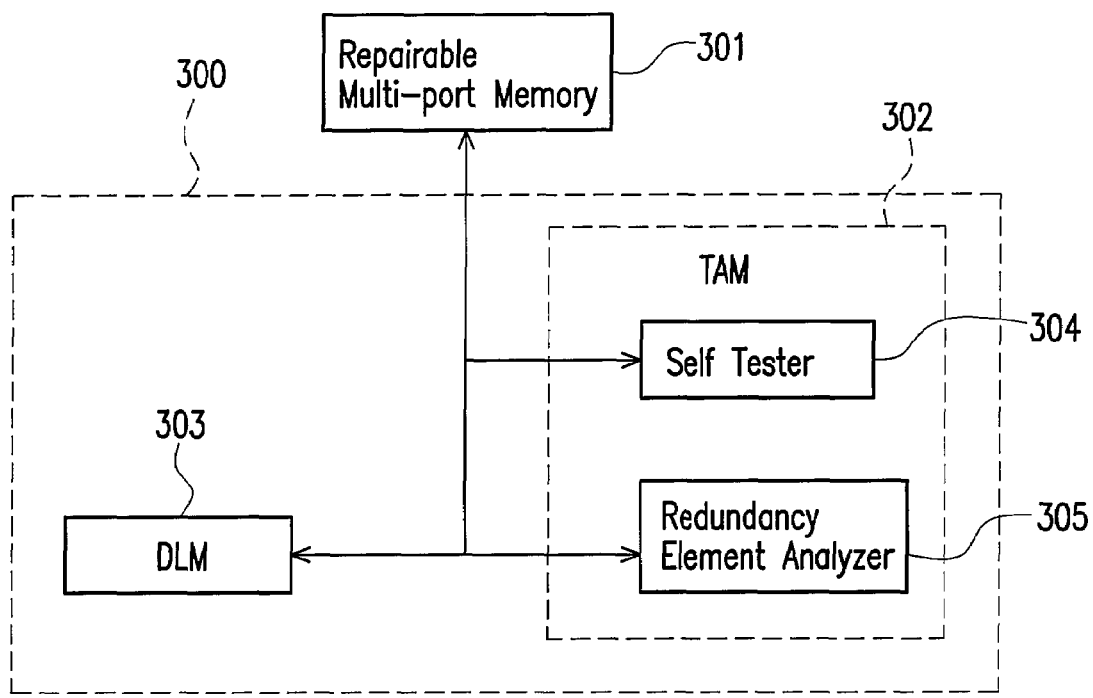
FIG. 3 is a diagram of a BISR circuit for a multi-port memory according to an embodiment of the present invention.
Figure 4:
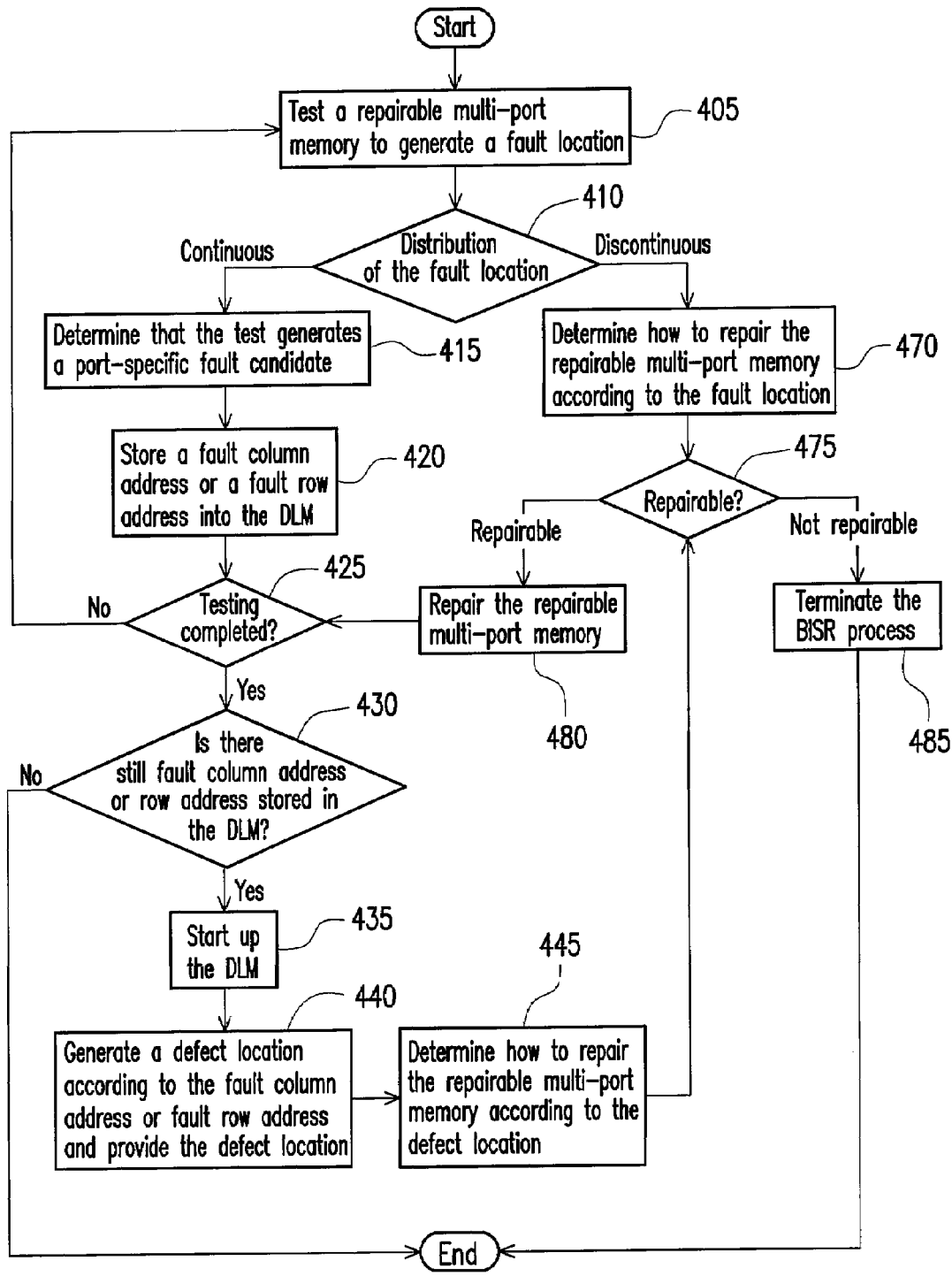
FIG. 4 is a flowchart illustrating a BISR method for a multi-port memory according to an embodiment of the present invention.

Please refer to FIG. 3 and FIG. 4 for following description. FIG. 3 is a diagram of a BISR circuit 300 for a multi-port memory according to an embodiment of the present invention, and FIG. 4 is a flowchart illustrating a BISR method for a multi-port memory executed by the BISR circuit 300. The BISR circuit 300 includes a test-and-analysis module (TAM) 302 and a defect locating module (DLM) 303, and the TAM 302 further includes a self tester 304 and a redundancy element analyzer 305. The repairable multi-port memory 301, the self tester 304, the redundancy element analyzer 305, and the DLM 303 are coupled to each other.

The procedure of FIG. 4 starts from step 405. In step 405, the self tester 304 tests the repairable multi-port memory 301 to generate a fault location. In step 410, the redundancy element analyzer 305 determines whether the test generates a port-specific fault candidate according to whether the fault location is continuous or discontinuous. If the fault location includes multiple continuous memory cells, the flow goes to step 415. In step 415, the redundancy element analyzer 305 determines that the test generates a port-specific fault candidate if the fault location includes a plurality of continuous memory cells in the same column or the same row. Here the term "candidate" is used because there are two possibilities in this case. The first possibility is that all the continuous memory cells are actually defective and there is no port-specific fault. The second possibility is the existence of a genuine port-specific fault. Whether the port-specific fault candidate is a real one or not is checked later in the DLM 303. If the fault occurs in the same column, which means the port-specific fault candidate is corresponding to a short circuit defect between bit lines, the redundancy element analyzer 305 stores the column address of the memory cells (referred as fault column address thereinafter) into the DLM 303 for further analysis in step 420. If the fault occurs in the same row, which means the port-specific fault candidate is corresponding to a short circuit defect between word lines, the redundancy element analyzer 305 stores the row address of the memory cells (referred as fault row address thereinafter) into the DLM 303 for further analysis in step 420.

Back to step 410, it is determined that the test in step 405 does not generate a port-specific fault candidate if the fault location does not include a plurality of continuous memory cells. In this case, the fault location is the defect location, and so that in step 470, the redundancy element analyzer 305 determines how to repair the repairable multi-port memory 301 directly according to the fault location. Next, in step 475, the redundancy element analyzer 305 determines whether the redundancy elements in the multi-port memory 301 are enough for repairing the defect therein. If so, the redundancy element analyzer 305 repairs the multi-port memory 301 in step 480. Otherwise, if the redundancy element analyzer 305 determines that the multi-port memory 301 is not repairable in step 475, the procedure proceeds to step 485 to terminate the self repair process illustrated in FIG. 4.

Steps 420 and 480 both go to step 425, wherein the self tester 304 determines whether the test to the multi-port memory 301 is completed. If the test is not yet completed, the procedure returns to step 405 to continue with the testing. Otherwise, if the test is already completed, the procedure proceeds to step 430, wherein the redundancy element analyzer 305 checks whether there is still fault column address or fault row address stored in the DLM 303 which has not be analyzed. The procedure illustrated in FIG. 4 ends here if there is no more unanalyzed fault column address or fault row address, otherwise the redundancy element analyzer 305 starts the DLM 303 in step 435. In step 440, the DLM 303 generates an actual defect location according to the fault column address or fault row address stored previously (which will be described in detail later on) and provides the defect location to the redundancy element analyzer 305. Then in step 445, the redundancy element analyzer 305 determines how to repair the repairable multi-port memory 301 according to the defect location. Next, in step 475, the redundancy element analyzer 305 determines whether the redundancy elements in the multi-port memory 301 are enough for repairing the defect. Following steps have been described above therefore will not be described herein again.

If the test in step 405 generates a port-specific fault candidate, the DLM 303 executes a defect locating algorithm to confirm and locate the actual defect location. As described above, in the present embodiment, the port-specific fault may be caused by a short circuit defect between word lines or bit lines, thus, the defect locating algorithm executed by the DLM 303 includes a word line defect locating algorithm and a bit line defect locating algorithm based on these two types of port-specific faults.

Figure 5A:
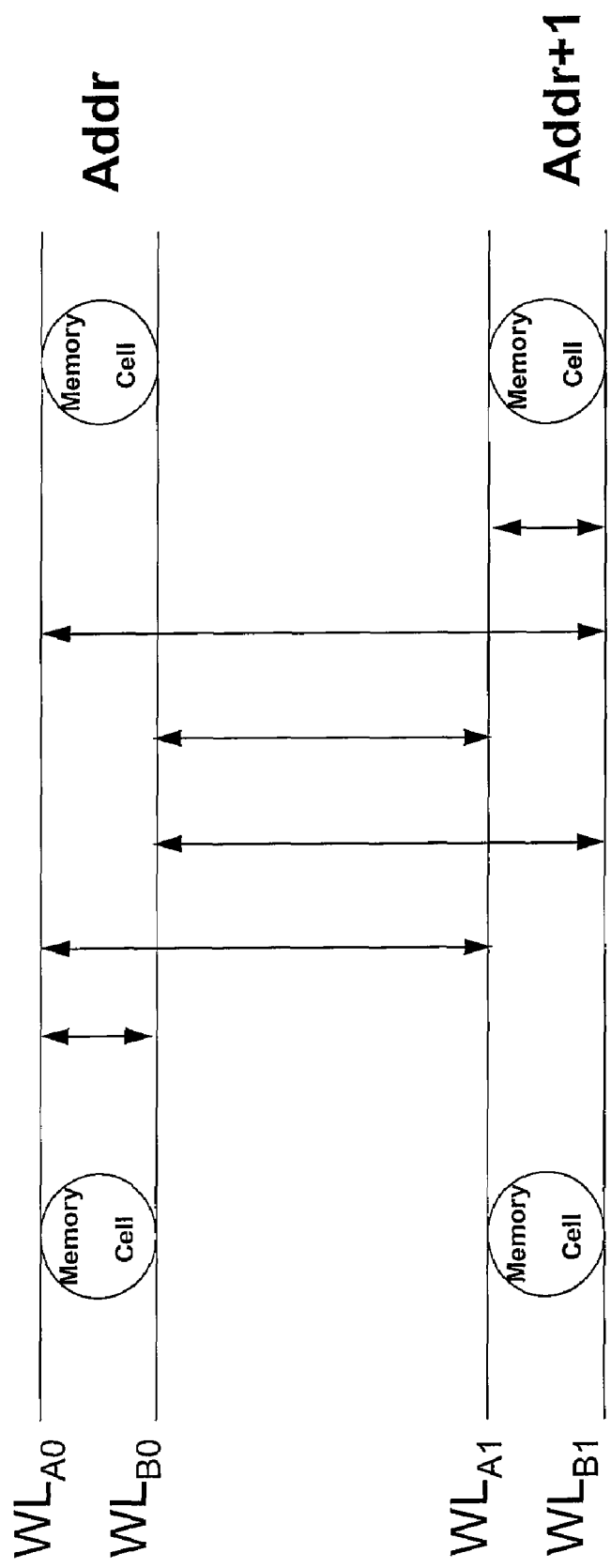

The word line defect locating algorithm will be described below. FIG. 5A illustrates four memory cells and four word lines $WL_{A0}$, $WL_{B0}$, $WL_{A1}$, and $WL_{B1}$ in the repairable multi-port memory 301. In the present embodiment, the multi-port memory 301 has two ports which are respectively port A and port B. Word line $WL_{A0}$ is corresponding to row address Addr and port A, word line $WL_{B0}$ is corresponding to row address Addr and port B, word line $WL_{A1}$ is corresponding to row address Addr+1 and port A, and word line $WL_{B1}$ is corresponding to row address Addr+1 and port B. FIG. 5A also illustrates six possible short circuit defects between these four word lines, and the table in FIG. 5B lists these six defects and the corresponding row addresses, namely, the actual defect locations. As shown in FIG. 5B, the first four word line defects are short circuit defects between different row addresses, thus, two row addresses are to be repaired and accordingly two redundancy rows in the multi-port memory 301 are required for repairing these two row addresses. The last two word line defects are short circuit defects corresponding to the same row address, thus, only one row address is to be repaired and accordingly only one redundancy row in the multi-port memory 301 is required for repairing this row address.

Figure 6:
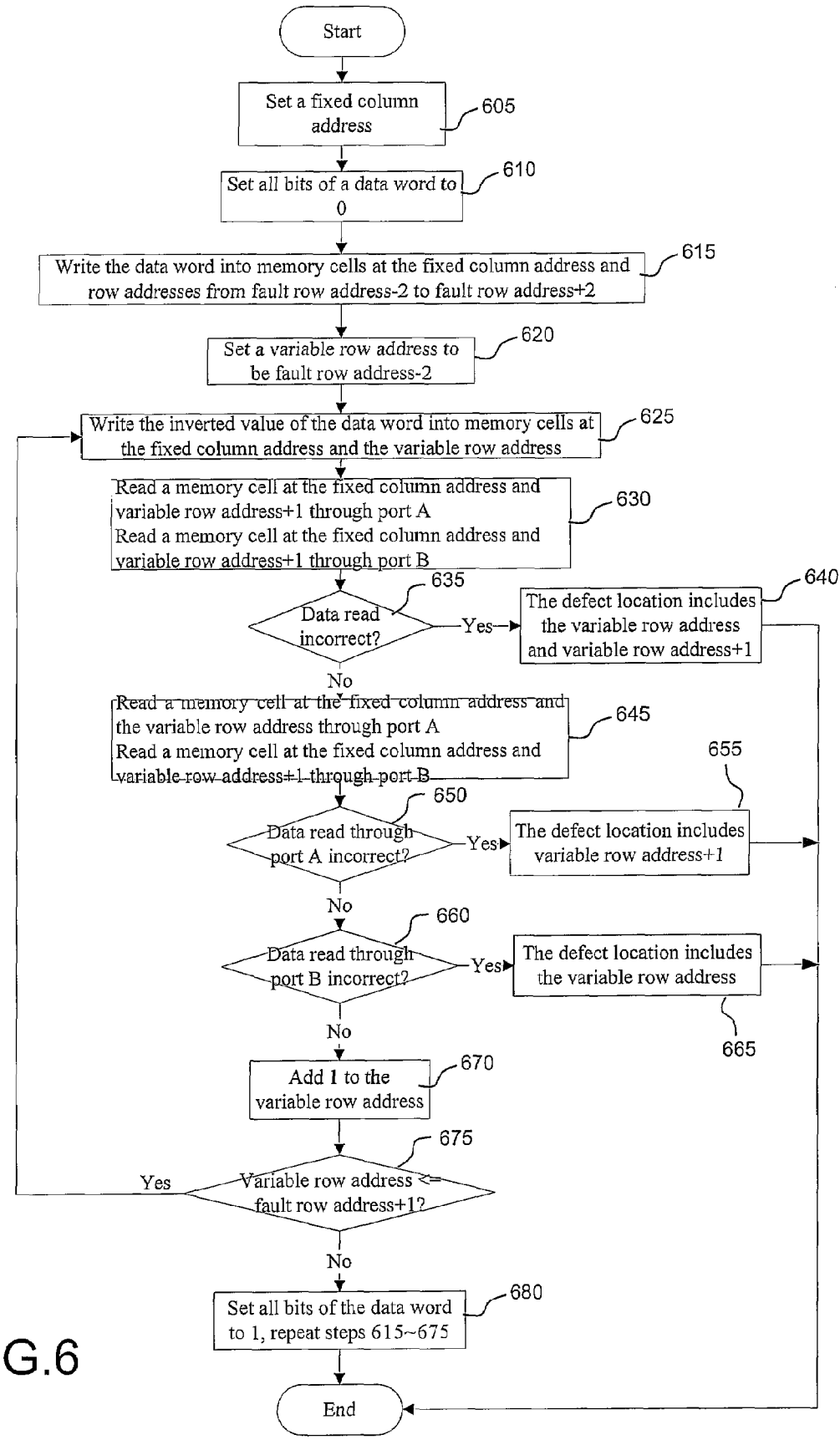
FIG. 6 is a flowchart illustrating a word line defect locating algorithm according to an embodiment of the present invention.

If the port-specific fault candidate is corresponding to a word line defect, the DLM 303 executes the word line defect locating algorithm in step 440, and the operation flow is illustrated in FIG. 6. In FIG. 6, all read/write operations are performed to the repairable multi-port memory 301, and a series of read/write tests are substantially performed around the fault row address to locate the actual defect. First, in step 605, a fixed column address is set, and the fixed column address may be any column address of the multi-port memory 301, and which is used in all the read/write steps in FIG. 6. Next, in step 610, all bits of a data word are set to 0. After that, in step 615, the data word is written into memory cells at the fixed column address and row addresses ranged from fault row address−2 to fault row address+2. This is to prevent the testing data written into the multi-port memory 301 in step 405 from interfering the defect locating algorithm.

Thereafter, in step 620, a variable row address is set to fault row address−2, and this variable row address will be used as a reference row address for subsequent read/write operations. In step 625, the inverted value of the data word is written into a memory cell at the fixed column address and the variable row address through any port. After that, in step 630, a memory cell at the fixed column address and the variable row address+1 is read through port A, and simultaneously a memory cell at the fixed column address and the variable row address+1 through port B. Then in step 635, the data read in step 630 is checked, wherein if the data read through port A or port B is not equal to foregoing data word, the port-specific fault is confirmed. The defect location is determined to be the variable row address and variable row address+1 in step 640, and the procedure ends here.

On the other hand, if the data read through port A and port B in step 630 is equal to the data word, the procedure proceeds to step 645, wherein a memory cell at the fixed column address and the variable row address is read through port A, and simultaneously a memory cell at the fixed column address and variable row address+1 is read through port B. After that, in step 650, whether the data read through port A is equal to the inverted value of the data word or not is determined. If the data read through port A is not equal to the inverted value of the data word, the port-specific fault is confirmed. The defect location is determined to be variable row address+1 in step 655 and the procedure ends here. Otherwise, if the data read through port A is equal to the inverted value of the data word, then in step 660, whether the data read through port B is equal to the data word or not is determined. If the data read through port B is not equal to the data word, the port-specific fault is also confirmed. The defect location is determined to be the variable row address in step 665 and the procedure ends here. Otherwise, if the data read through port B is equal to the data word, step 670 is executed.

Next, in step 670, 1 is added to the variable row address, and then in step 675, whether or not the variable row address is smaller than or equal to fault row address+1 is determined. If the variable row address is smaller than or equal to fault row address+1, step 625 is executed; otherwise, step 680 is executed to set all bits of the data word to 1 and steps 615~675 are then repeated.

It can be understood by comparing FIG. 5B and FIG. 6 that the first four short circuit defects in FIG. 5B can be located in steps 630~640, the sixth defect can be located in steps 645~655, and the fifth defect can be located in steps 645, 660, and 665.

Figure 7A:
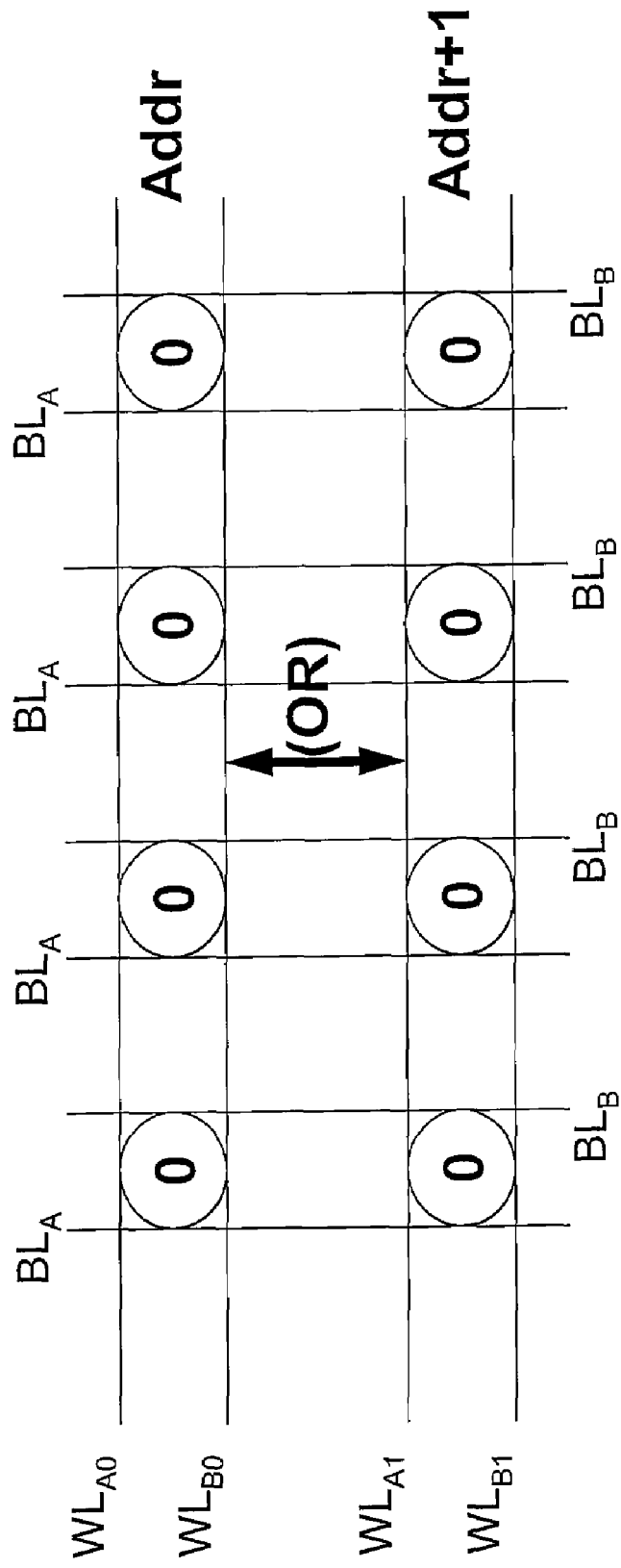
FIGS. 7A~7C, FIGS. 8A~8C, and FIGS. 9A~9D illustrate examples of detecting short circuit defects between word lines according to an embodiment of the present invention.
Figure 7B:
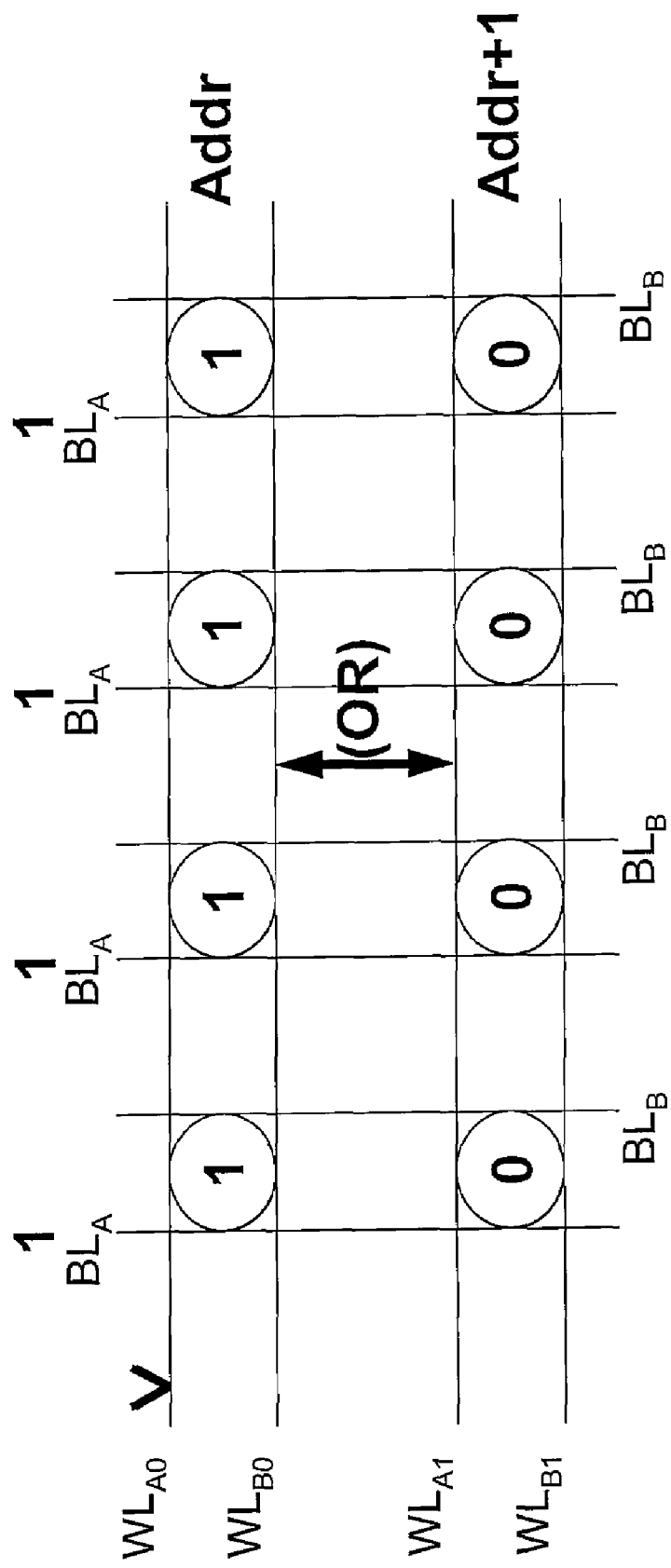
Figure 7C:
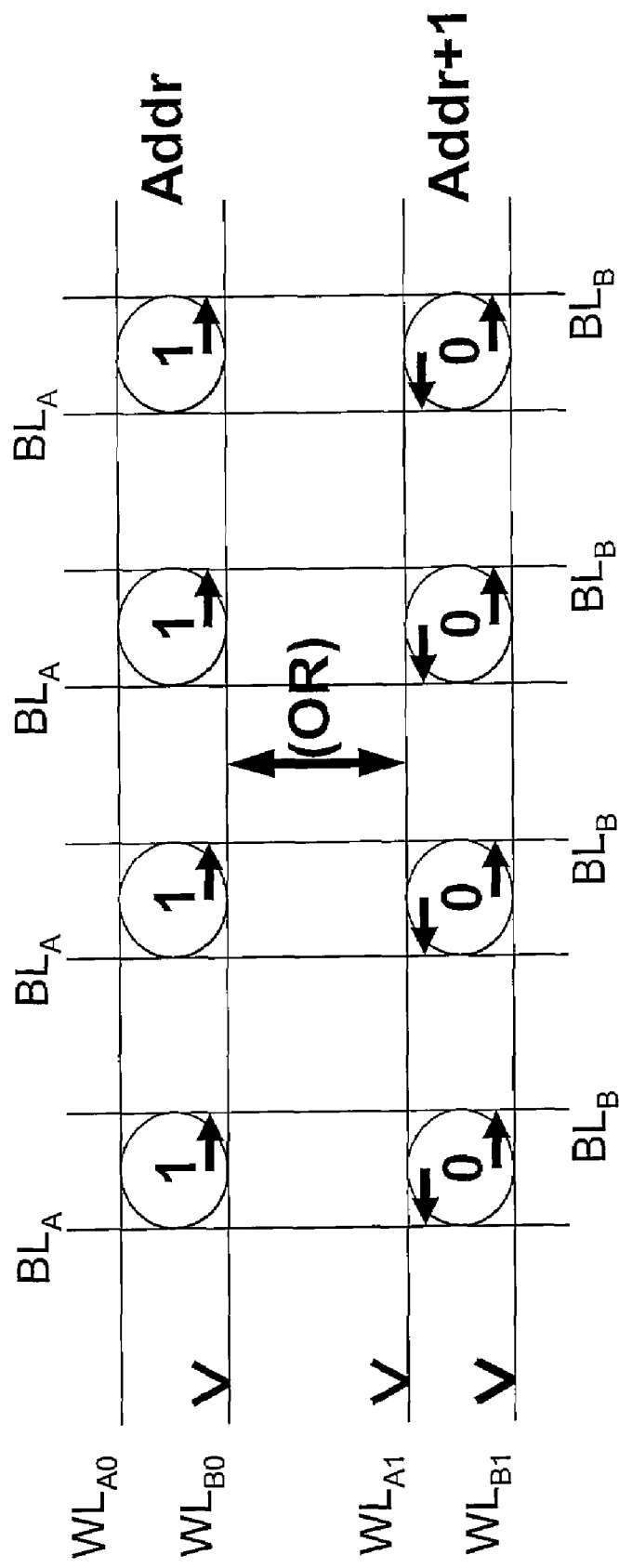

How the word line defect locating algorithm in the present embodiment detects the defect location will be explained with three examples. Please refer to FIG. 6 and FIGS. 7A~7C for the first example. FIGS. 7A~7C illustrate eight memory cells (circles in the figures) and related word lines and bit lines of the repairable multi-port memory 301, wherein word lines $WL_{A0}$, $WL_{B0}$, $WL_{A1}$, and $WL_{B1}$ are the same as those illustrated in FIG. 5A, and $BL_A$ and $BL_B$ are bit lines of respectively port A and port B. In the first example, there is an OR-type short circuit defect between word lines $WL_{B0}$ and $WL_{A1}$. In other words, if this defect causes two memory cells to output to the same bit line, the bit line will output an OR calculation result of the data in the two memory cells.

In the procedure illustrated in FIG. 6, all the memory cells are initialized to 0 after step 615, as shown in FIG. 7A. In step 625, 1 is written into memory cells at row address Addr when the variable row address is Addr. Assuming 1 is written through port A, the word line $WL_{A0}$ is enabled as shown in FIG. 7B. Next, in step 630, word lines $WL_{A1}$ and $WL_{B1}$ are both enabled to read memory cells at row address Addr+1 through both port A and port B. Here the word line $WL_{B0}$ is also enabled due to the short circuit defect, which causes the memory cells at row addresses Addr and Addr+1 to output to the bit line $BL_B$ at the same time, as shown in FIG. 7C. Thus, in step 635, it is determined that the data read through port A is correct while the data read through port B is always 1 instead of 0. Accordingly, step 640 is executed and it is determined that the defect location includes row addresses Addr and Addr+1, namely, both row addresses Addr and Addr+1 are to be repaired.

Figure 8A:
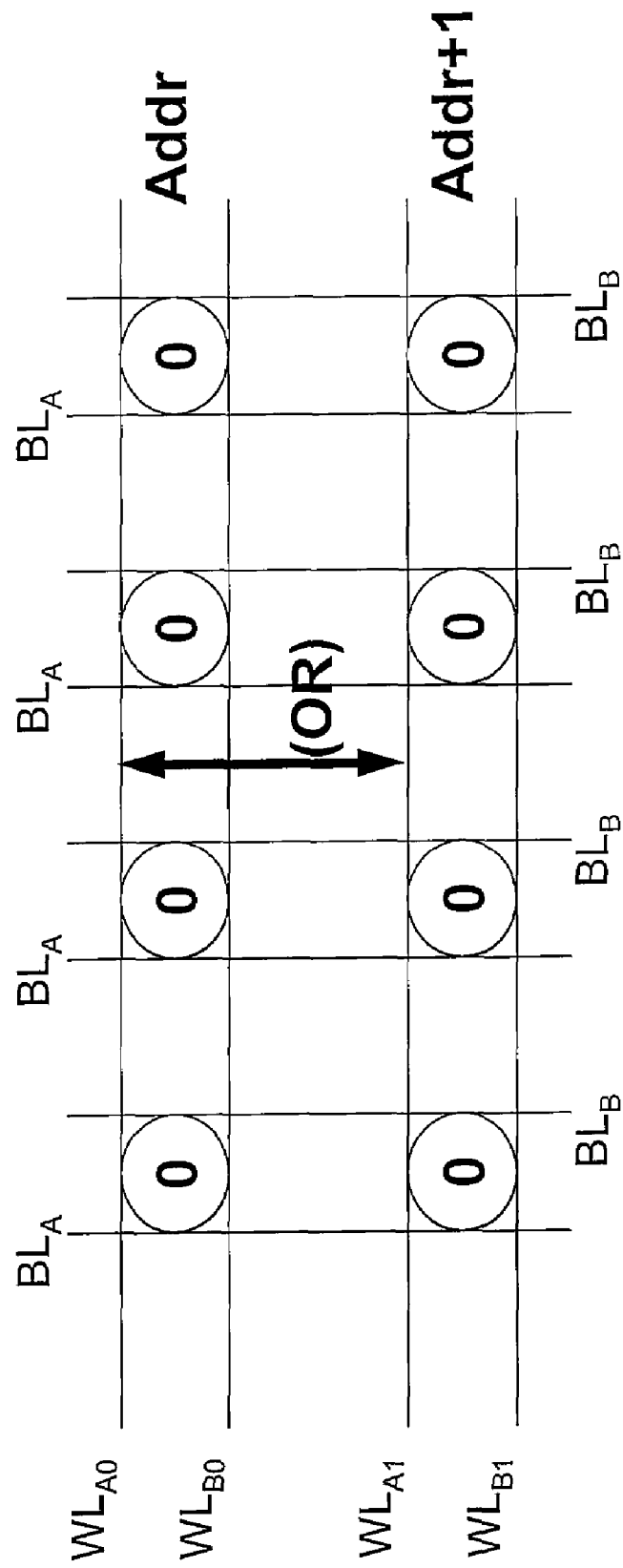
Figure 8B:
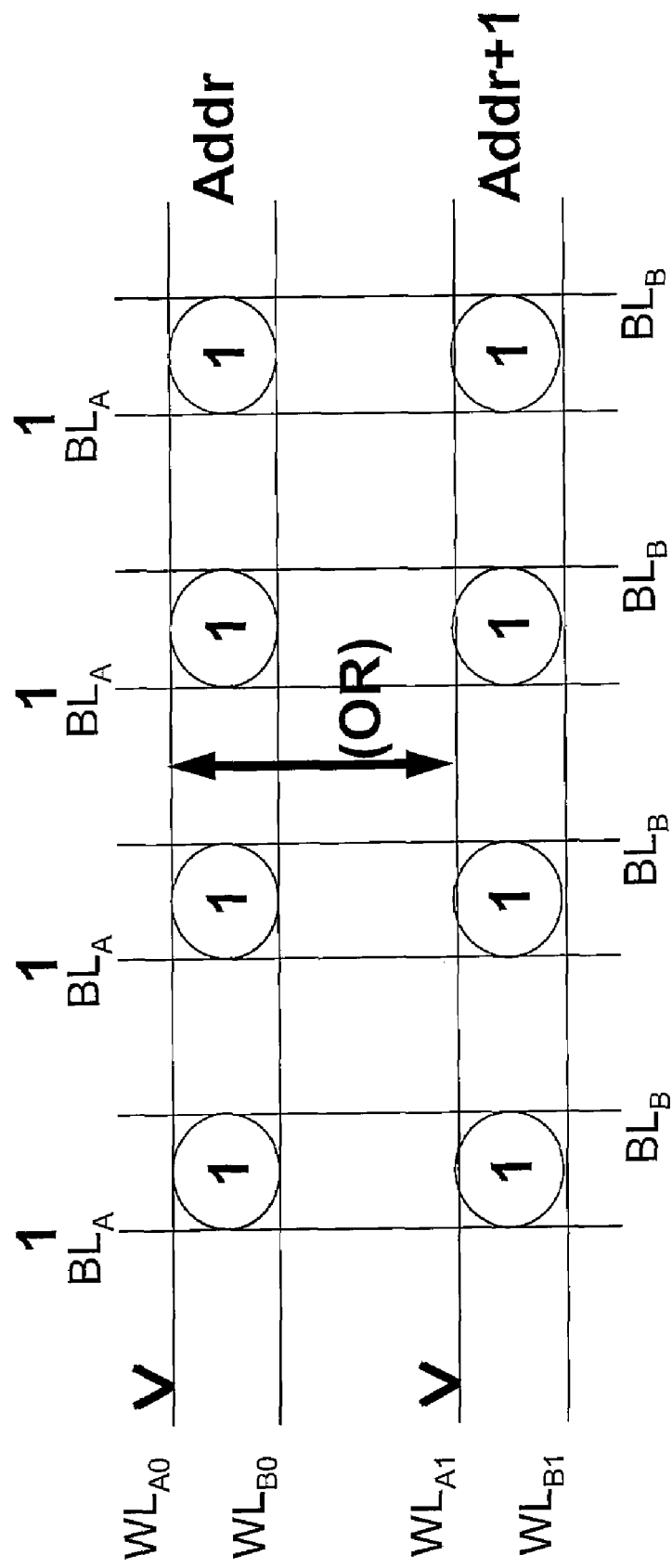
Figure 8C:
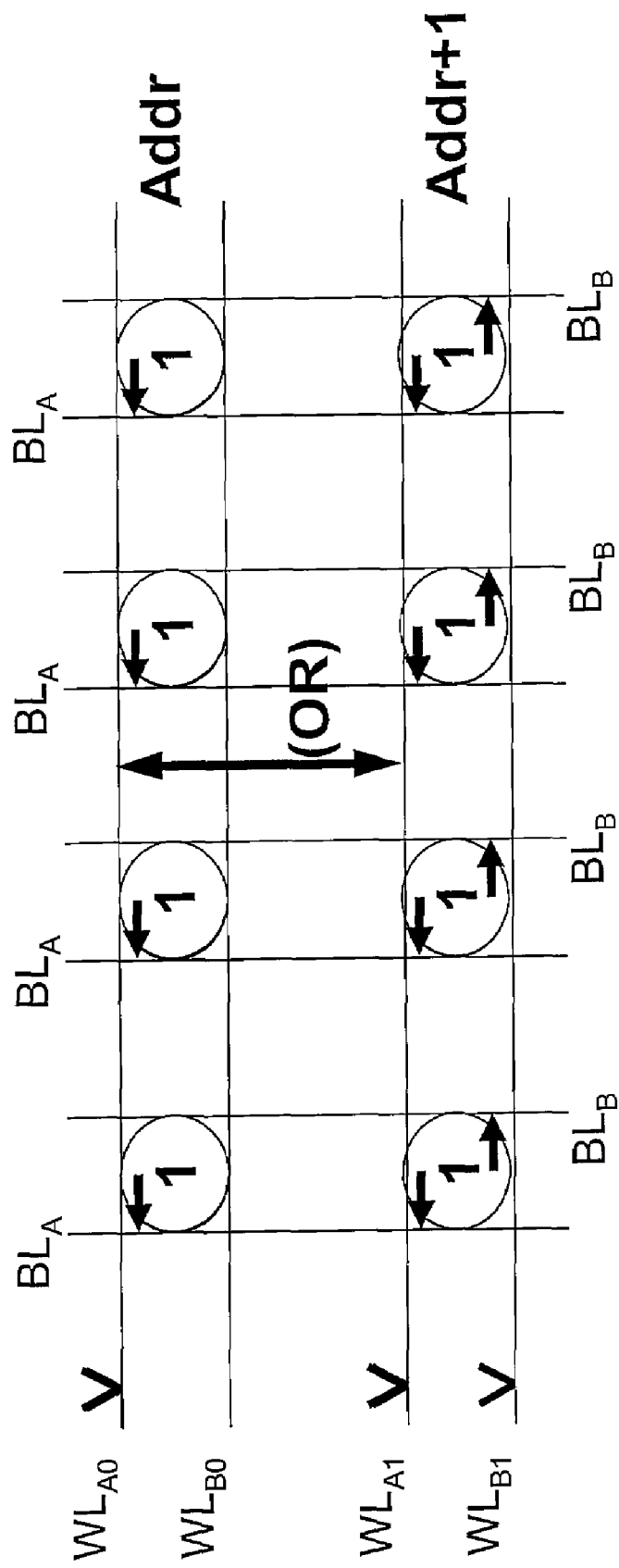

Please refer to FIG. 6 and FIGS. 8A~8C for the second example. In the second example, there is also an OR-type short circuit defect between word lines $WL_{A0}$ and $WL_{A1}$. In the procedure illustrated in FIG. 6, all the memory cells are initialized to 0 after step 615, as shown in FIG. 8A. In step 625, 1 is written into memory cells at row address Addr when the variable row address is Addr. Assuming 1 is written through port A, the word line $WL_{A0}$ is enabled, and due to the short circuit defect, the word line $WL_{A1}$ is also enabled and which causes the memory cell at row address Addr+1 to be written as well, as shown in FIG. 8B. After that, in step 630, word lines $WL_{A1}$ and $WL_{B1}$ are both enabled to read the memory cells at row address Addr+1 through both port A and port B. Here due to the short circuit defect, the word line $WL_{A0}$ is also enabled, which causes the memory cells at row addresses Addr and Addr+1 to output to the bit line $BL_A$ at the same time, as shown in FIG. 8C. Thus, in step 635, it is determined that the data read through port A and port B is always 1 instead of 0. Accordingly, step 640 is executed and it is determined that the defect location includes row addresses Addr and Addr+1, namely, both row addresses Addr and Addr+1 are to be repaired.

Please refer to FIG. 6 and FIGS. 9A~9D for the third example. In the third example, there is a short circuit defect between word lines $WL_{A1}$ and $WL_{B1}$; however, different from foregoing two examples, this short circuit defect is an AND-type defect. In other words, if this defects causes two memory cells to output to the same bit line, this bit line will output an AND calculation result of the data in the two memory cells.

Figure 9A:
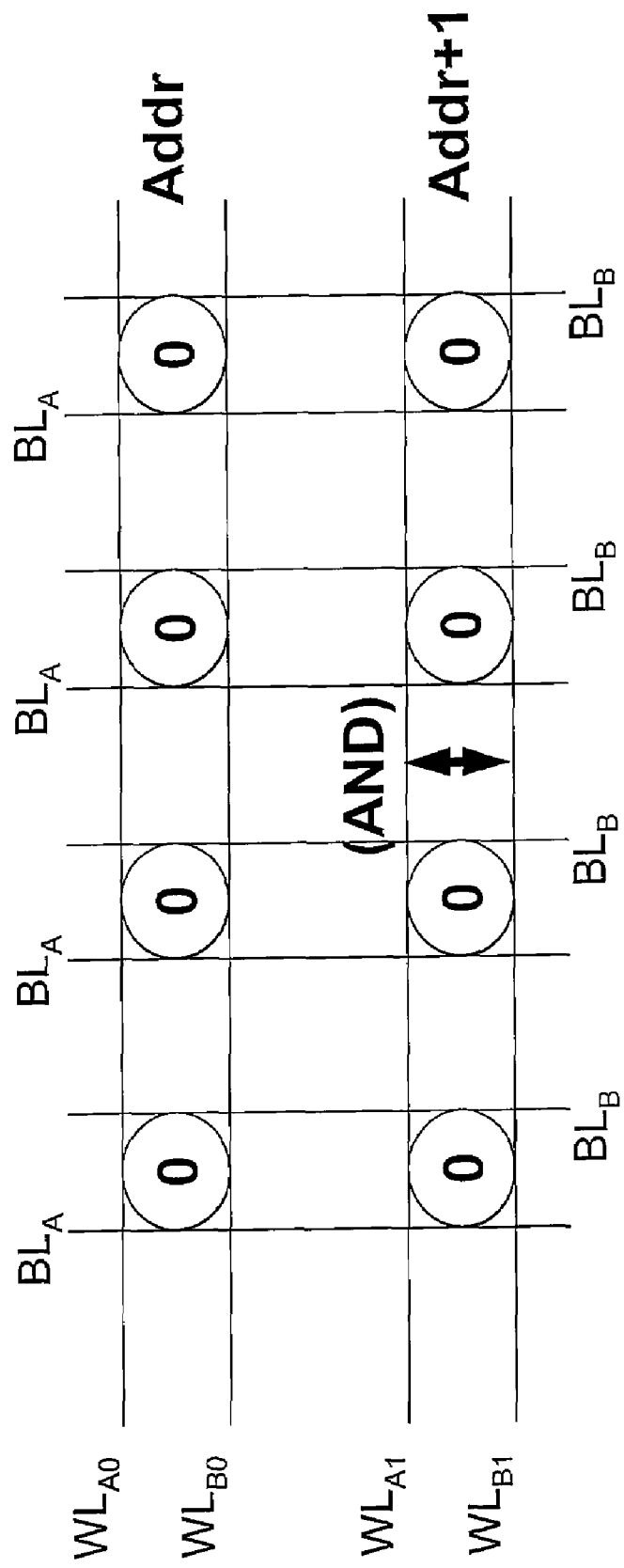
Figure 9B:
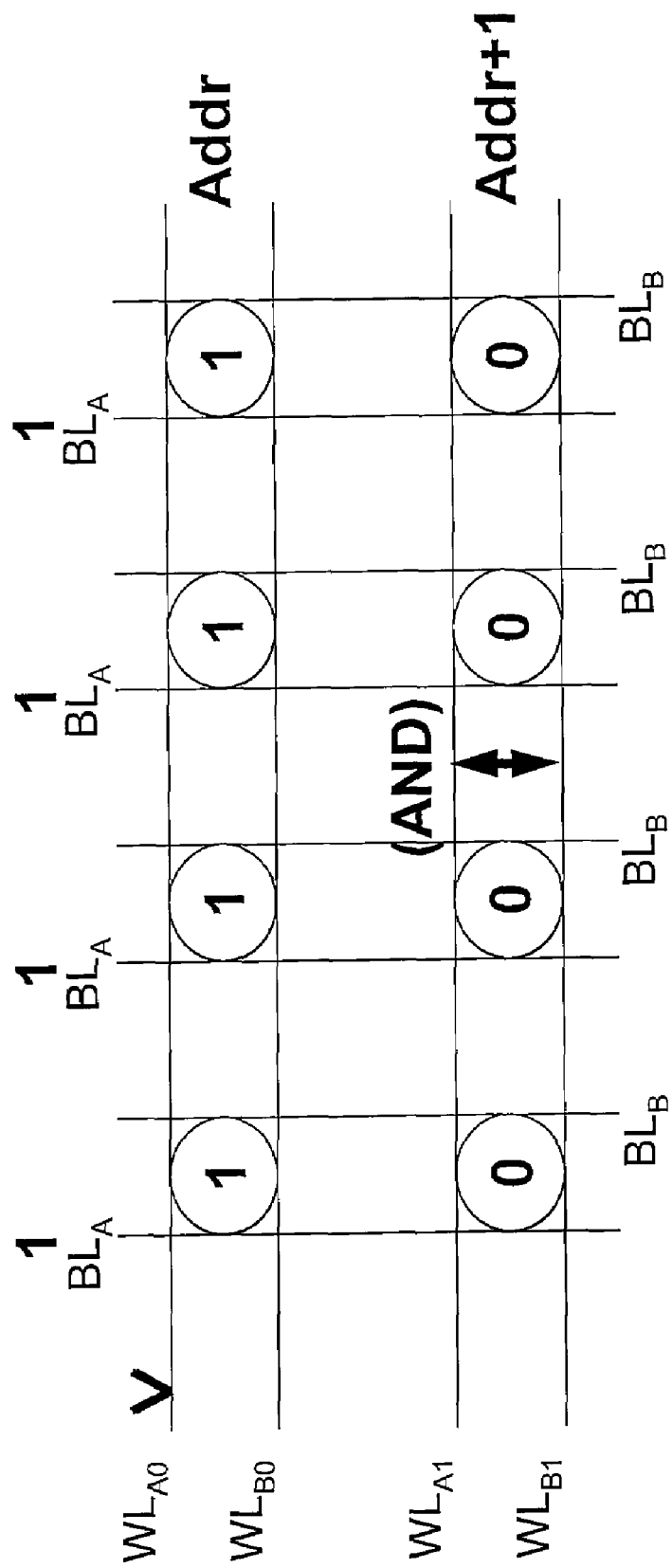
Figure 9C:
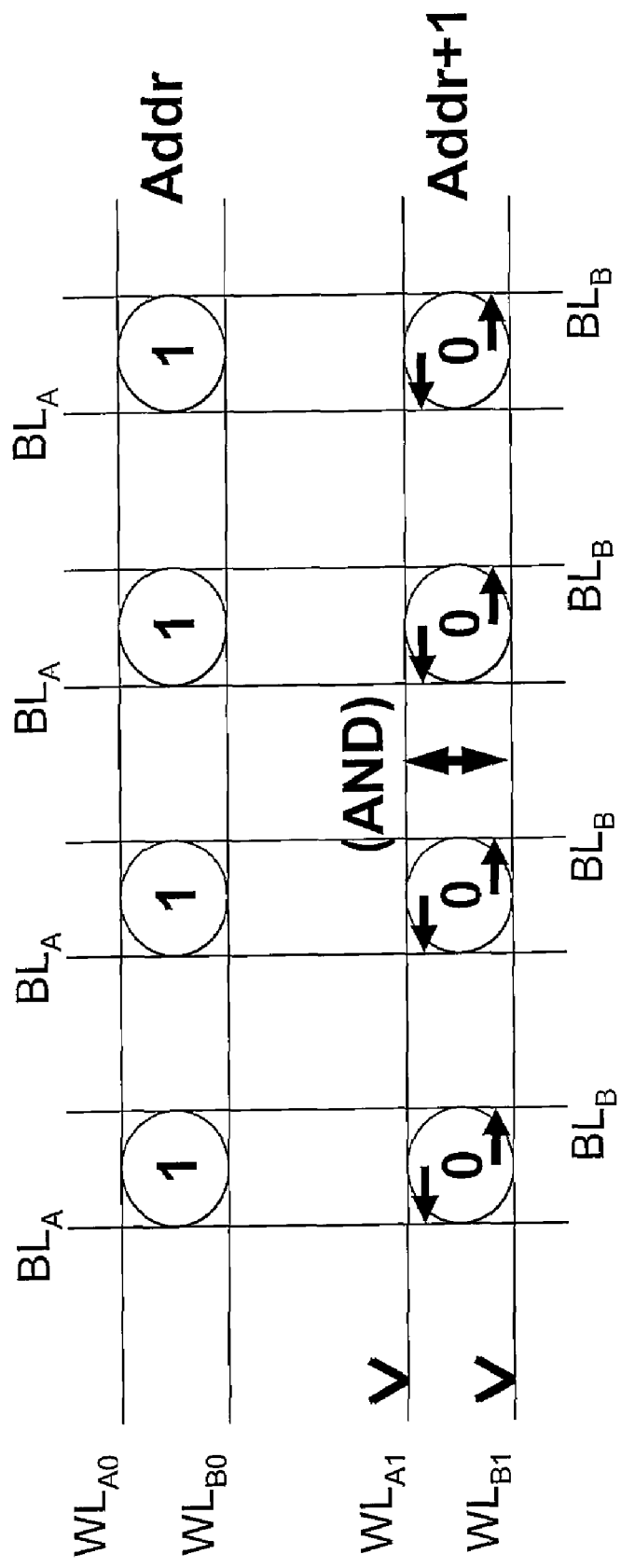
Figure 9D:
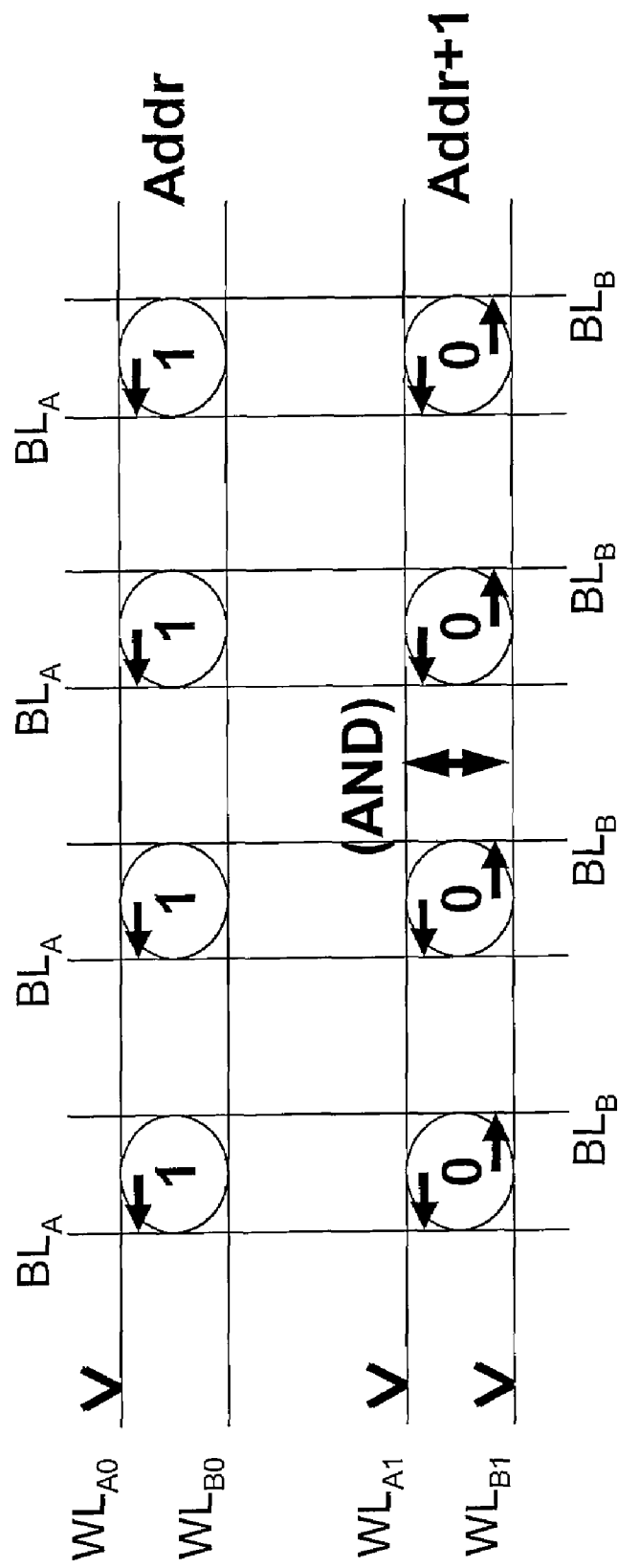

In the procedure illustrated in FIG. 6, all the memory cells are initialized to 0 after step 615, as shown in FIG. 9A. In step 625, 1 is written into memory cells at row address Addr when the variable row address is Addr. Assuming 1 is written through port A, the word line $WL_{A0}$ is enabled, as shown in FIG. 9B. Then in step 630, word lines $WL_{A1}$ and $WL_{B1}$ are both enabled to read memory cells at row address Addr+1 through both port A and port B, as shown in FIG. 9C. Here the short circuit defect does not affect the testing result, therefore it is determined in step 635 that the data read in step 630 is correct. Next, in step 645, word lines $WL_{A0}$ and $WL_{B1}$ are both enabled to read the memory cell at row address Addr through port A and the memory cell at row address Addr+1 through port B. Here due to the short circuit defect, the word line $WL_{A1}$ is also enabled, and which causes the memory cells at row addresses Addr and Addr+1 both output to the bit line $BL_A$, as shown in FIG. 9D. Thus, in step 650, it is determined that the data read through port A is always 0 instead of 1. Accordingly, step 655 is executed and it is determined that the defect location includes row address Addr+1, namely, only one row is to be repaired.

Besides the defects described in foregoing three examples, other word line defects listed in FIG. 5B may also be located through the word line defect locating algorithm illustrated in FIG. 6, and the procedures thereof are similar to the three examples described above therefore will not be described herein.

Figure 10:
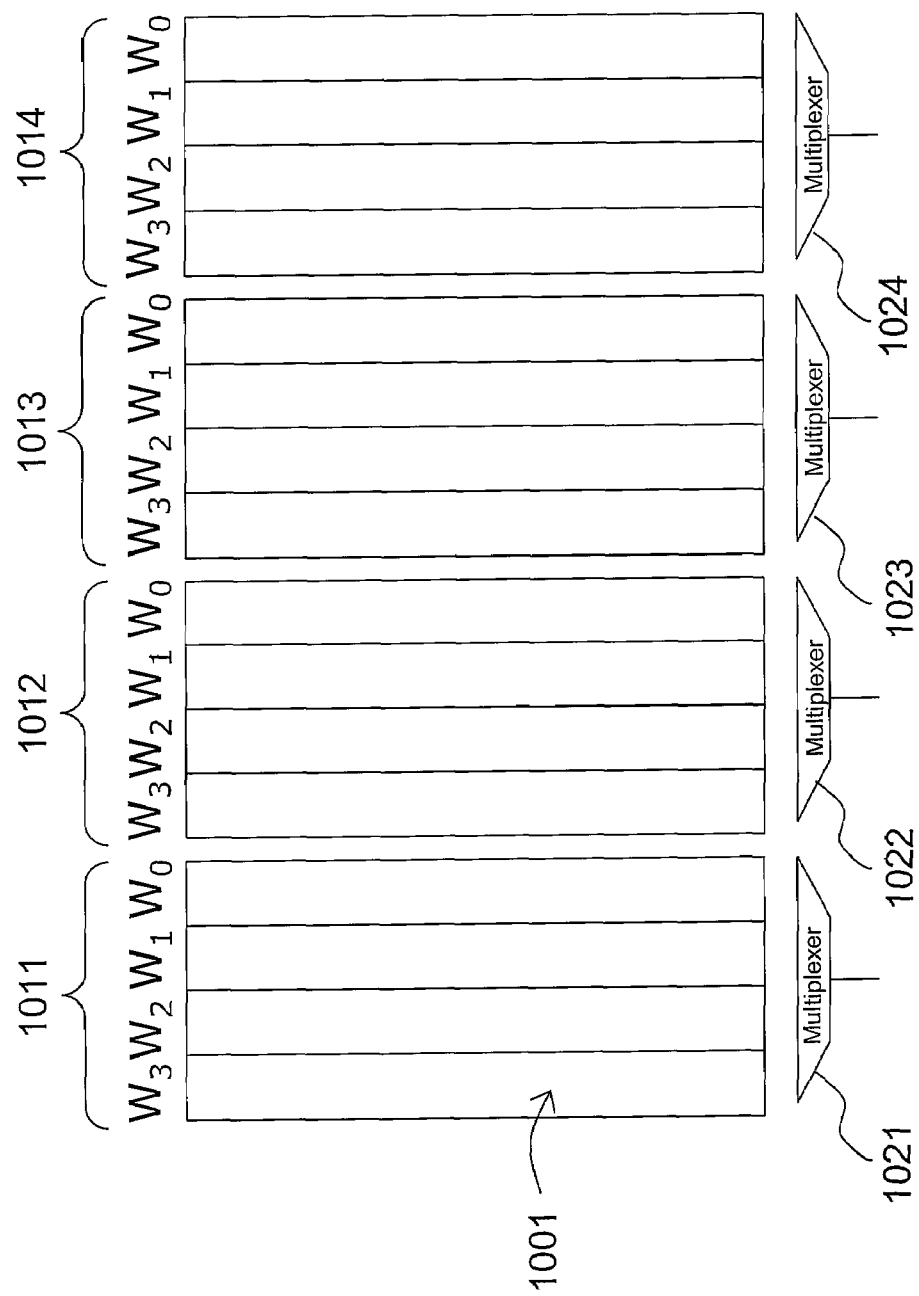
FIG. 10 is a partial view of the repairable multi-port memory in FIG. 3.

The bit line defect locating algorithm in the present embodiment will be explained below. The bit line defect locating algorithm in the present embodiment is designed regarding to a repairable multi-port memory having sub-array configuration. In the present embodiment, the repairable multi-port memory 301 is in sub-array configuration, as shown in FIG. 10. FIG. 10 is a partial view of the repairable multi-port memory 301. Memory cells in the multi-port memory 301 are arranged into a plurality of columns, for example, 1001 is one of the columns. Every four columns form an array, for example, arrays 1011~1014. The bits in each word of the multi-port memory 301 are distributed in various arrays, for example, words $W_0$~$W_3$ respectively have a bit in arrays 1011~1014. The column addresses of word $W_0$~$W_3$ are respectively 0~3. The column addresses of two adjacent bits in the same row have two possibilities. The first possibility is that the column addresses are different by 1, for example, bits of words $W_1$ and $W_2$ are adjacent to each other, and bits of words $W_2$ and $W_3$ are adjacent to each other. The second possibility is that the column addresses of the two adjacent bits are respectively the largest and the smallest column address, for example, bits of words $W_0$ and $W_3$ are adjacent to each other. The multi-port memory 301 includes multiplexers 1021~1024 respectively coupled to the arrays 1011~1014. Each of the multiplexers 1021~1024 outputs one of the columns in the corresponding array according to a column address the multiplexer receives, and the outputs of the multiplexers 1021~1024 form a complete data word.

Figure 11A:
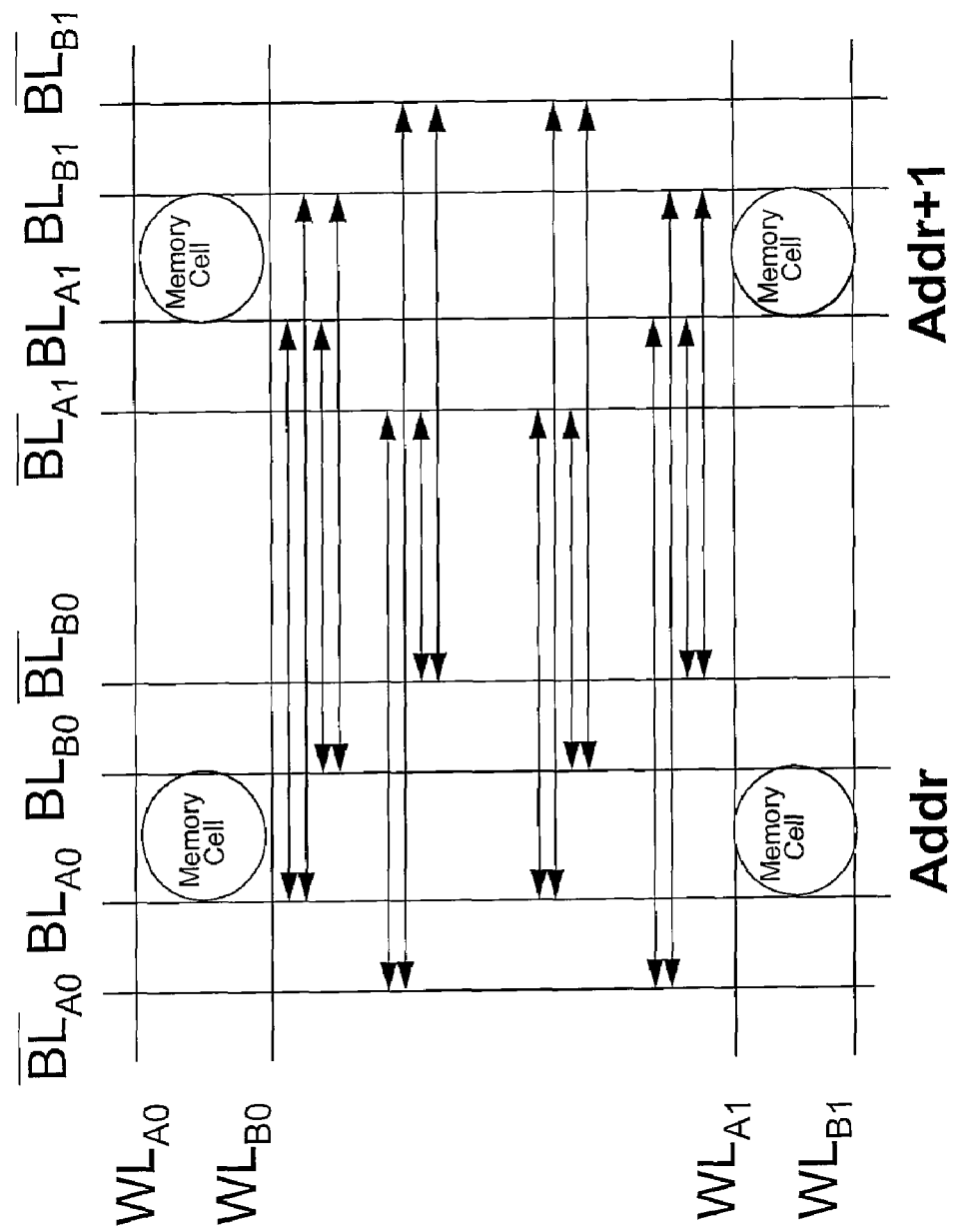

FIGS. 11A and 11B illustrate various short circuit defects between bit lines in the present embodiment. FIG. 11A illustrates four memory cells and related word lines and bit lines in the repairable multi-port memory 301. Word lines $WL_{A0}$, $WL_{B0}$, $WL_{A1}$, and $WL_{B1}$ are the same as those illustrated in FIG. 5A. $BL_{A0}$ and $\overline{BL}_{A0}$ are bit lines corresponding to port A and column address Addr. $BL_{B0}$ and $\overline{BL}_{B0}$ are bit lines corresponding to port B and column address Addr. $BL_{A1}$ and $\overline{BL}_{A1}$ are bit lines corresponding to port A and column address Addr+1. $BL_{B1}$ and $\overline{BL}_{B1}$ are bit lines corresponding to port B and column address Addr+1. Each column of memory cells has four bit lines, and there may be the combination of $4^2=16$ different short circuit defects between the bit lines of two columns of memory cells, as listed in FIG. 11B, wherein two column of memory cells have to be repaired regarding each bit line defect.

Short circuit defects between bit lines in the same column can be correctly detected and located by a conventional testing algorithm, therefore is not considered in the present invention.

Figure 12:
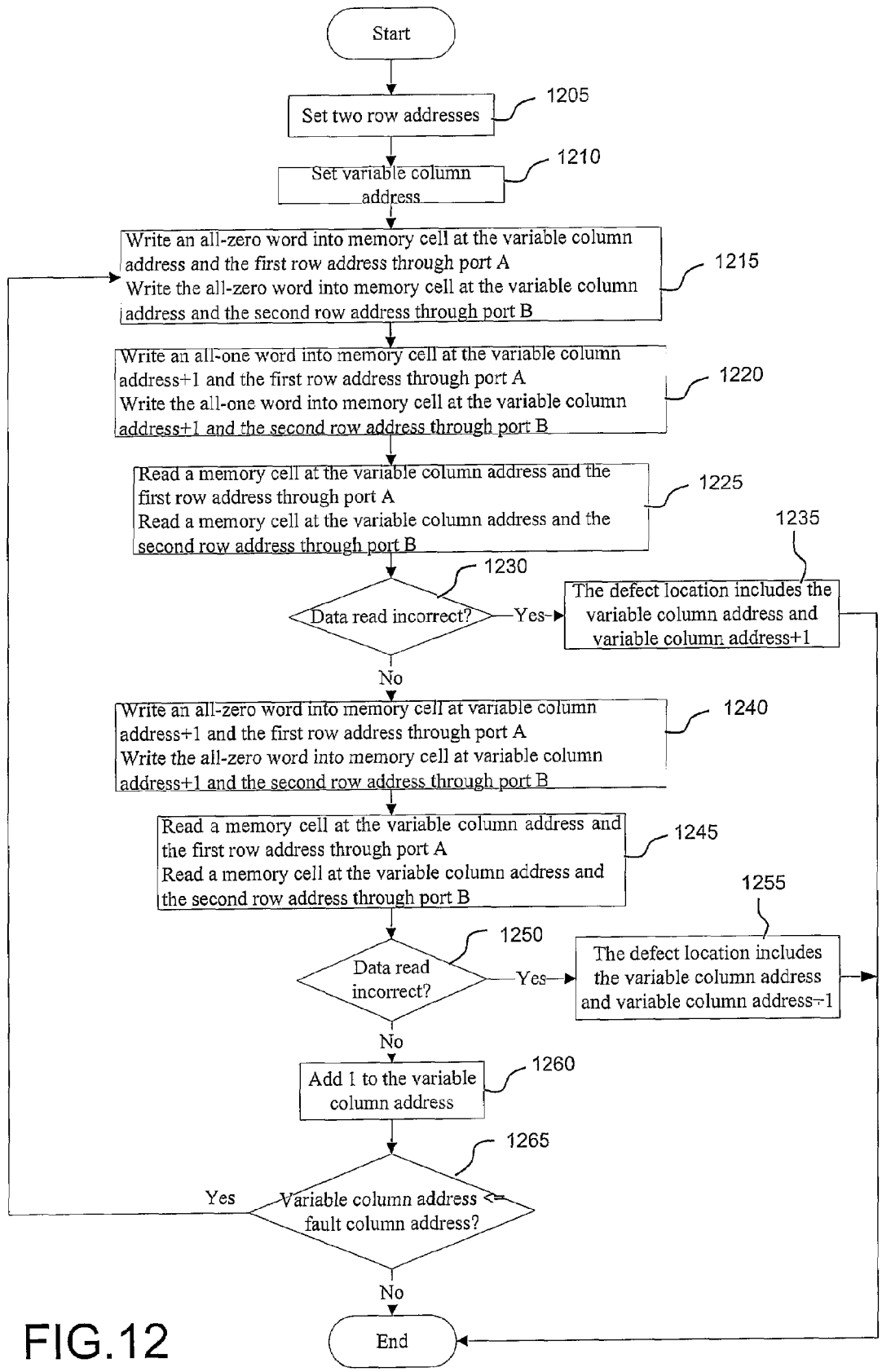
FIG. 12 is a flowchart illustrating a bit line defect locating algorithm according to an embodiment of the present invention.

If the detected port-specific fault candidate is corresponding to a bit line defect, in step 440, the DLM 303 executes the bit line defect locating algorithm as illustrated in FIG. 12. All read/write operations in FIG. 12 are performed to the repairable multi-port memory 301, and a series of read/write tests are substantially performed around the fault column address to locate the actual defect. First, in step 1205, two row addresses are set as the testing range, and in the present embodiment, these two row addresses may be any two adjacent row addresses in the multi-port memory 301, and which are referred as the first row address and the second row address thereinafter. The analysis range of foregoing word line defect locating algorithm can be avoided to prevent the interference thereof. For example, if row addresses 2~7 have been set as the analysis range in foregoing word line defect locating algorithm, these row addresses are considered unusable in subsequent bit line defect locating algorithm to prevent the interference thereof.

Thereafter, in step 1210, a variable column address is set to be the fault column address provided by the redundancy element analyzer 305 minus 1, and the variable column address will be used as a reference column address in subsequent operations.

Two data words are used for testing in the procedure illustrated in FIG. 12, wherein all bits of the first word are 0 so that the first word is referred as all-zero word thereinafter, and all bits of the second word are 1 so that the second word is referred as all-one word. Next, in step 1215, the all-zero word is written into a memory cell at the variable column address and the first row address through port A of the repairable multi-port memory 301, and simultaneously the all-zero word is written into a memory cell at the variable column address and the second row address through port B of the repairable multi-port memory 301. In step 1220, the all-one word is written into a memory cell at variable column address+1 and the first row address through port A, and simultaneously the all-one word is written into a memory cell at variable column address+1 and the second row address through port B. In step 1225, a memory cell at the variable column address and the first row address is read through port A, and simultaneously a memory cell at the variable column address and the second row address is read through port B. Thereafter, in step 1230, whether the data read in step 1225 is correct is determined. If the data read through port A or port B is not equal to the all-zero word, the port-specific fault is confirmed. It is determined in step 1235 that the defect location includes the variable column address and variable column address+1, namely, these two columns are both to be repaired. If the data read through port A and port B is always equal to the all-zero word, step 1240 is then executed.

Next, in step 1240, the all-zero word is written into a memory cell at variable column address+1 and the first row address through port A, and simultaneously the all-zero word is written into a memory cell at variable column address+1 and the second row address through port B. In step 1245, a memory cell at the variable column address and the first row address is read through port A, and simultaneously a memory cell at the variable column address and the second row address is read through port B. After that, in step 1250, whether the data read in step 1245 is correct is determined. If the data read through port A or port B is not equal to the all-zero word, the port-specific fault is confirmed. It is determined in step 1255 that the defect location includes the variable column address and variable column address+1, namely, these two columns are both to be repaired. If the data read through port A and port B is always equal to the all-zero word, step 1260 is executed to add 1 to the variable column address. Then in step 1265, if it is determined that the variable column address is smaller than or equal to the fault column address, step 1215 is then executed, otherwise the procedure ends here.

Figure 13A:
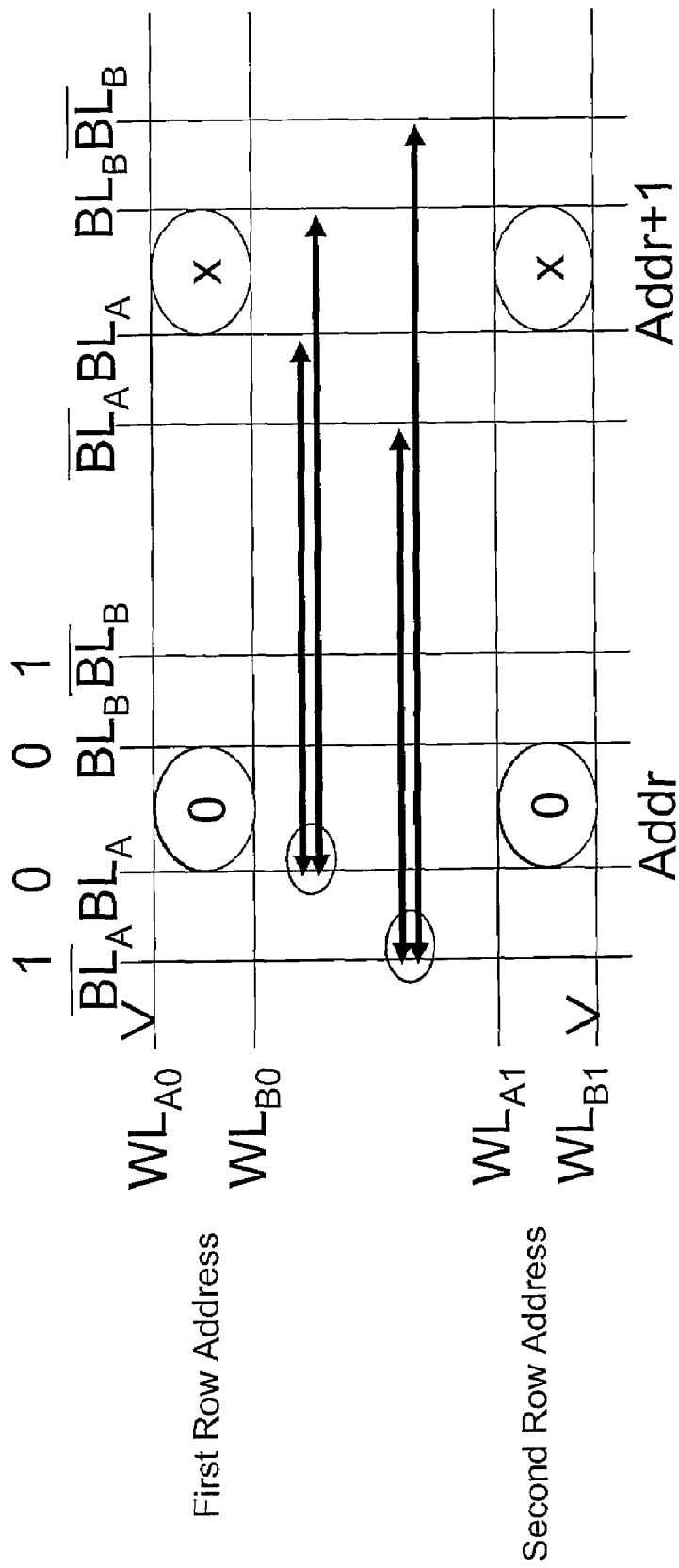
FIGS. 13A~13C and FIGS. 14A~14D illustrate examples of detecting short circuit defects between bit lines according to an embodiment of the present invention.
Figure 13B:
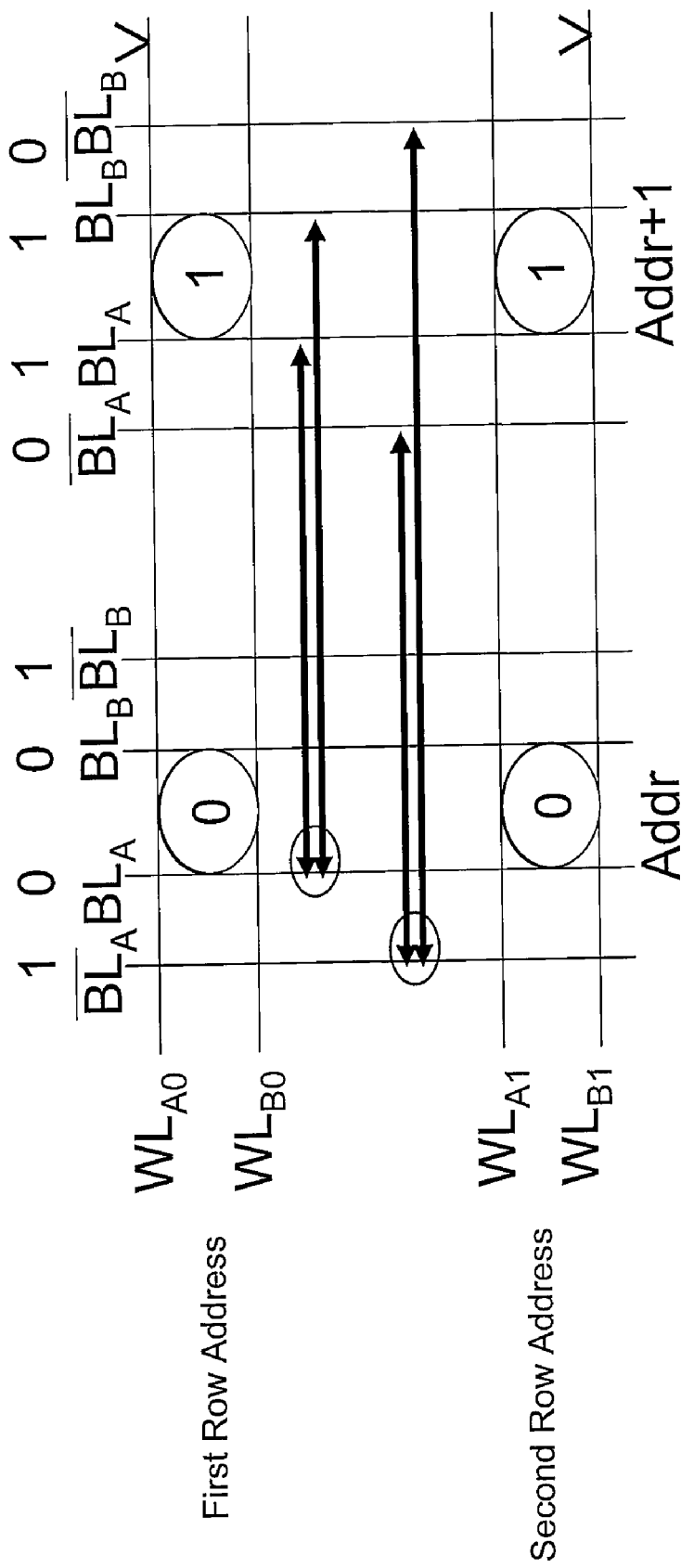
Figure 13C:
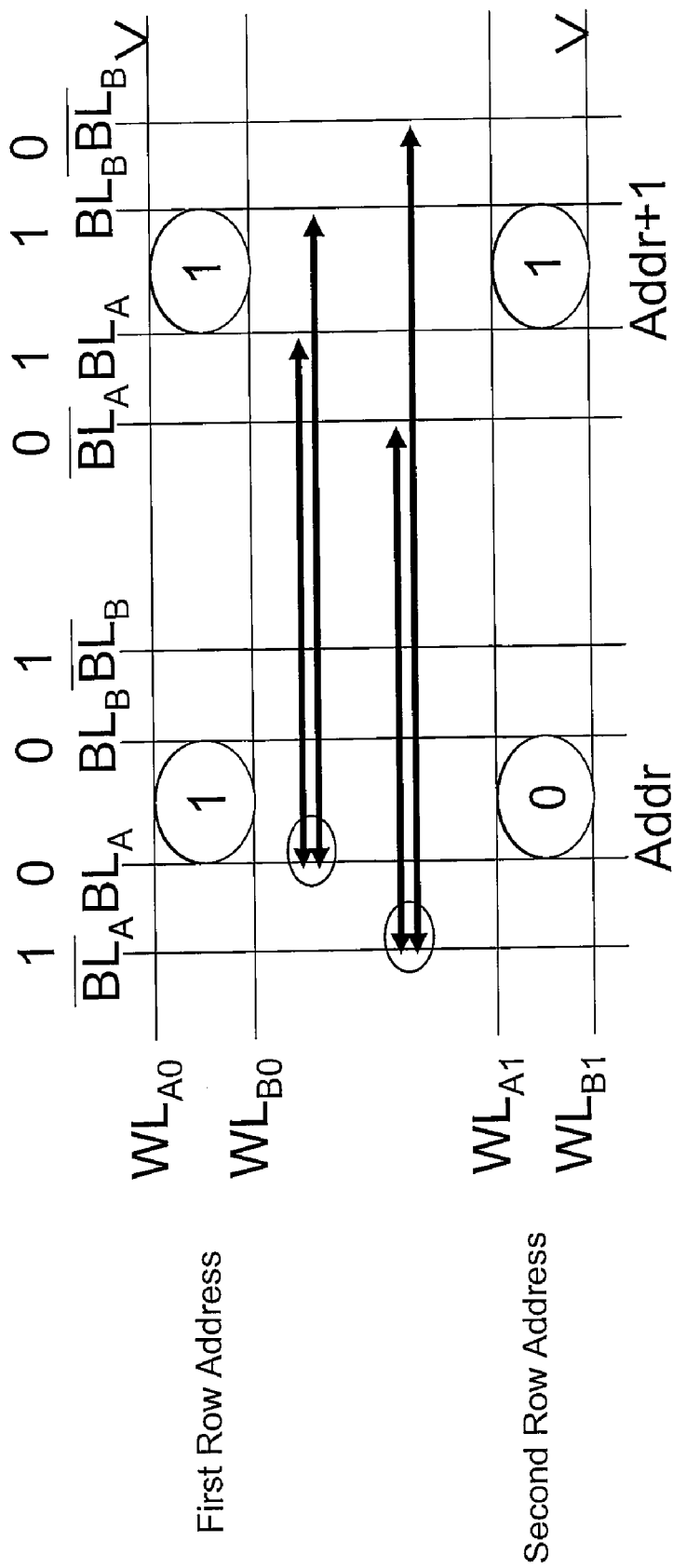

How the procedure in FIG. 12 locates the actual defect location according to the fault column address provided by the redundancy element analyzer 305 will be explained with two examples. Please refer to FIGS. 13A~13C for the first example. FIGS. 13A~13C illustrate four memory cells and related word lines and bit lines in the repairable multi-port memory 301, wherein word lines WLA0, WLB0, WLA1, and WLB1 are the same as those illustrated in FIG. 5A. $BL_A$ and $\overline{BL}_A$ are bit lines of port A, and $BL_B$ and $\overline{BL}_B$ are bit lines of port B. The four bidirectional arrows in FIGS. 13A~13C denote four bit line short circuit defects respectively being a short circuit between $BL_A$ s at two columns, a short circuit between $BL_A$ at column address Addr and $BL_B$ at column address Addr+1, a short circuit between $\overline{BL}_A$ s at two columns, and a short circuit between $\overline{BL}_A$ at column address Addr and $\overline{BL}_B$ at column address Addr+1. These four defects have the same triggering procedure therefore will be described together.

In the procedure illustrated in FIG. 12, in step 1215, when the variable column address is Addr, word lines $WL_{A0}$ and $WL_{B1}$ are enabled and 0 is written into memory cells at column address Addr, as shown in FIG. 13A. Next, in step 1220, 1 is written into memory cells at column address Addr+

1, as shown in FIG. 13B. Here due to the short circuit between the two bit lines, the memory cell at the crossing between the first row address and the column address Addr is also written with 1, as shown in FIG. 13C. After that, in steps 1225 and 1230, it is determined that the data read through port A is incorrect, and then it is determined in step 1235 that the defect location includes column addresses Addr and Addr+1, namely, both column addresses Addr and Addr+1 are to be repaired.

Please refer to FIGS. 14A~14D for the second example. The four bidirectional arrows in FIGS. 14A~14D denote four bit line short circuit defects respectively being a short circuit between $BL_B$ at column address Addr and $\overline{BL}_A$ at column address Addr+1, a short circuit between $BL_B$ at column address Addr and $\overline{BL}_B$ at column address Addr+1, a short circuit between $\overline{BL}_B$ at column address Addr and $BL_A$ at column address Addr+1, and a short circuit between $\overline{BL}_B$ at column address Addr and $BL_B$ at column address Addr+1. These four defects also have the same triggering procedure therefore will be described together.

Figure 14A:
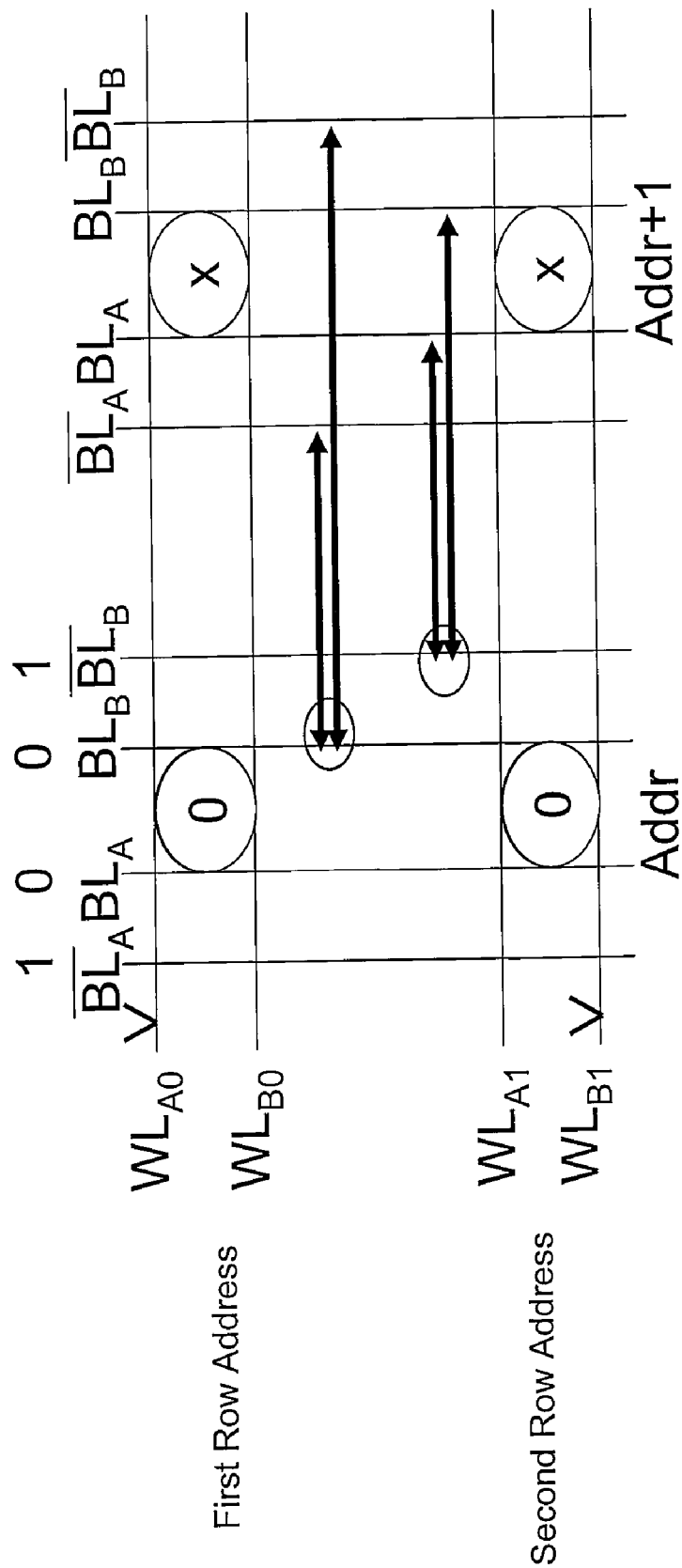
Figure 14B:
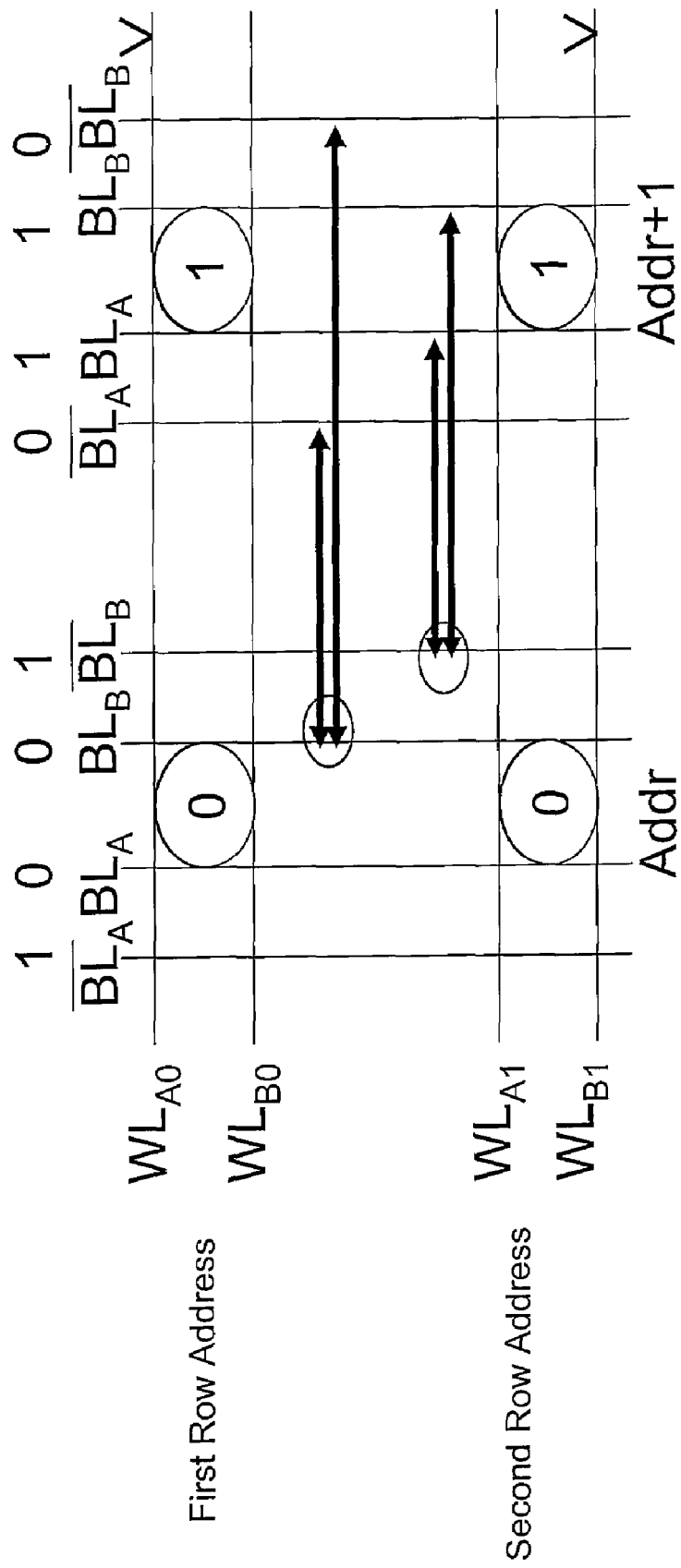
Figure 14C:
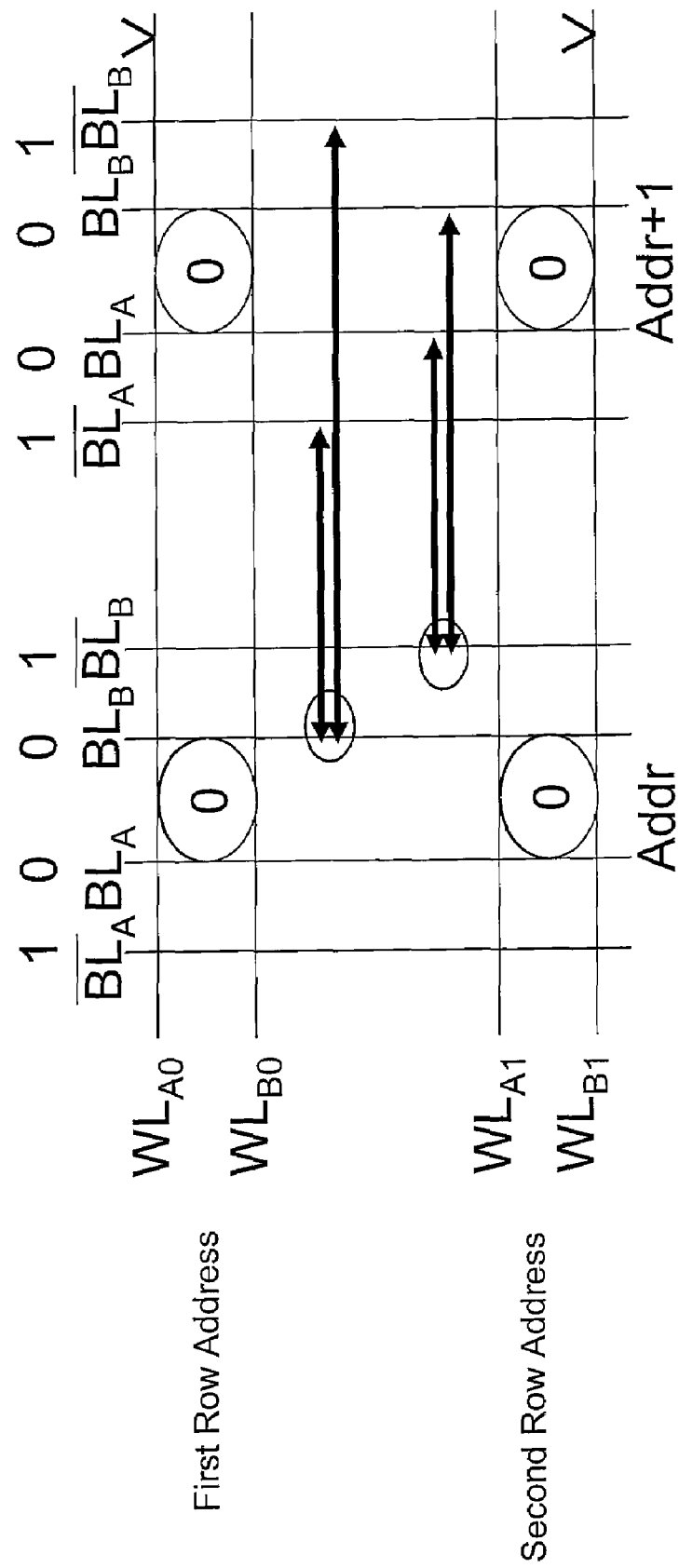
Figure 14D:
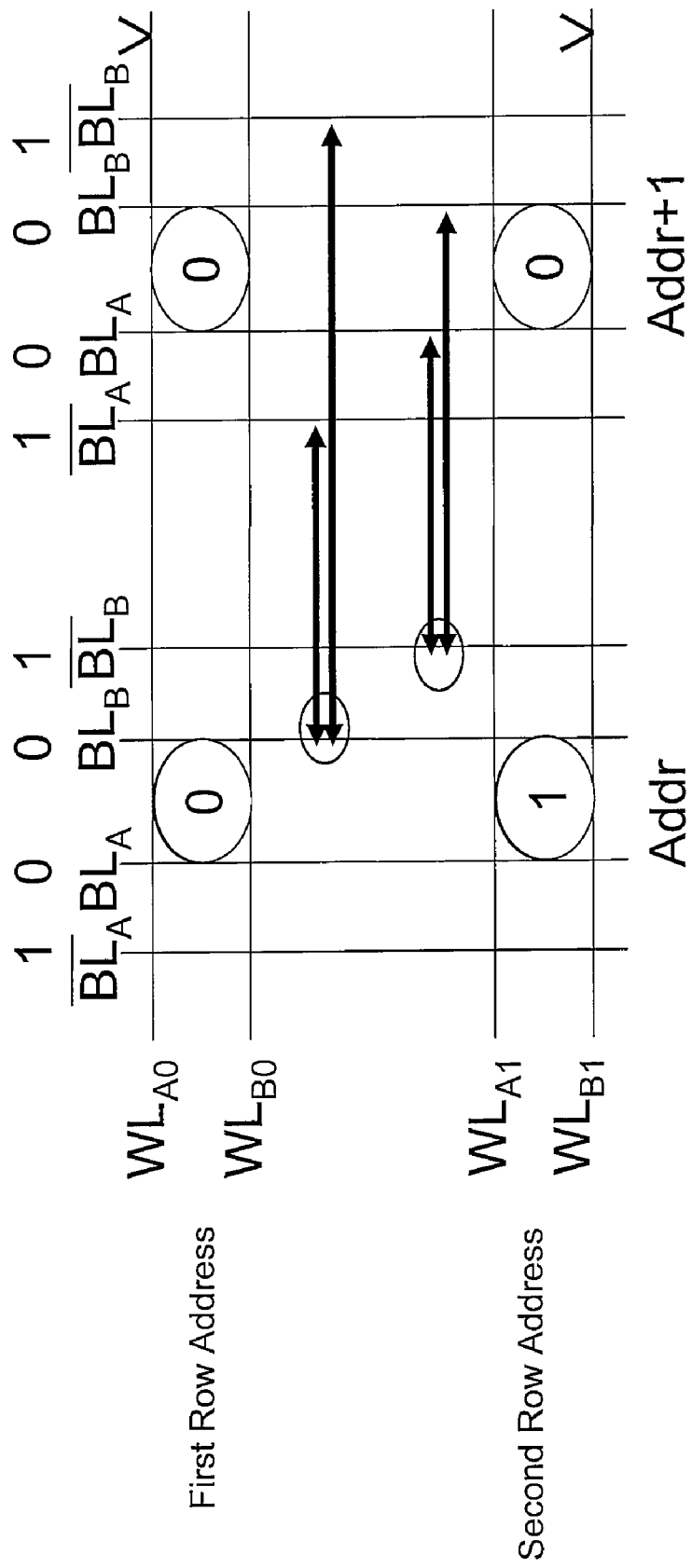

In the procedure illustrated in FIG. 12, in step 1215, when the variable column address is Addr, word lines $WL_{A0}$ and $WL_{B1}$ are enabled and 0 is written into memory cells at column address Addr, as shown in FIG. 14A. Next, in step 1220, 1 is written into memory cells at column address Addr+ 1, as shown in FIG. 14B. In steps 1225 and 1230, the two shorted bit lines produce the same signal, therefore no fault is generated. Next, in step 1240, 0 is written into memory cells at column address Addr+1, as shown in FIG. 14C. Here due to the short circuit defect between the two bit lines, 1 is written into the memory cell at the crossing of the second row address and column address Addr, as shown in FIG. 14D. After that, in steps 1245 and 1250, it is determined that the data read through port B is incorrect, thus, in step 1255, it is determined that the defect location includes column addresses Addr and Addr+1, namely, column addresses Addr and Addr+1 are both to be repaired.

Besides the eight defects described in foregoing two examples, the other eight bit line short circuit defects listed in FIG. 11B may also be located through the bit line defect locating algorithm illustrated in FIG. 12, and the procedures thereof are similar to foregoing two examples therefore will not be described herein.

As described above, in the present invention, defects causing port-specific faults are categorized and a specific triggering and locating procedure is executed corresponding to each defect category so that the corresponding defect location can be obtained based on the fault generated in the locating process. Accordingly, in the present invention, accurate and complete defect locations can be provided based on those seeming fault locations, so that inaccurate or incomplete repairs to a multi-port memory, and accordingly waste of redundancy elements, can be avoided. Moreover, according to the present invention, the product yield can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A built-in self repair (BISR) circuit for a repairable multi-port memory, comprising:
   a test-and-analysis module (TAM); and
   a defect locating module (DLM), coupled to the TAM; wherein the TAM tests the repairable multi-port memory to generate a fault location and determines whether the test generates a port-specific fault candidate according to the fault location, and if the test generates a port-specific fault candidate, the DLM generates a defect location based on the fault location and provides the defect location to the TAM so that the TAM determines how to repair the repairable multi-port memory according to the defect location.

2. The BISR circuit according to claim 1, wherein if the test does not generate a port-specific fault candidate, the TAM determines how to repair the repairable multi-port memory according to the fault location.

3. The BISR circuit according to claim 1, wherein if the TAM determines that the test generates a port-specific fault candidate, the TAM starts up the DLM to generate the defect location.

4. The BISR circuit according to claim 1, wherein the TAM comprises:
 a self tester, for testing the repairable multi-port memory to generate the fault location; and
 a redundancy element analyzer, coupled to the self tester and the DLM, the redundancy element analyzer determining whether the test generates a port-specific fault candidate according to the fault location and determining how to repair the repairable multi-port memory according to the defect location.

5. The BISR circuit according to claim 1, wherein the repairable multi-port memory is in sub-array configuration.

6. The BISR circuit according to claim 1, wherein if the fault location comprises a plurality of continuous memory cells in the same row, the TAM determines that the test generates a port-specific fault candidate corresponding to a word line defect and stores the row address of the memory cells into the DLM as a fault row address; if the fault location comprises a plurality of memory cells in the same column, the TAM determines that the test generates a port-specific fault candidate corresponding to a bit line defect and stores the column address of the memory cells into the DLM as a fault column address.

7. The BISR circuit according to claim 6, wherein the DLM executes a plurality of locating steps to the repairable multi-port memory to generate the defect location if the port-specific fault candidate is corresponding to a word line defect, the locating steps comprise:
 (e) writing the inverted value of a data word into a memory cell at a fixed column address and a variable row address;
 (f) reading a memory cell at the fixed column address and row address Addr+PD through a first port of the repairable multi-port memory, and simultaneously reading a memory cell at the fixed column address and row address Addr+PD through a second port of the repairable multi-port memory, wherein Addr is the variable row address, and PD is a predetermined integer;
 (g) the defect location comprising row addresses Addr and Addr+PD if the data read through the first port or the second port in step (f) is not equal to the data word;
 (h) reading a memory cell at the fixed column address and row address Addr through the first port, and simultaneously reading a memory cell at the fixed column address and row address Addr+PD through the second port;
 (i) the defect location comprising row address Addr+PD if the data read through the first port in step (h) is not equal to the inverted value of the data word; and
 (j) the defect location comprising row address Addr if the data read through the second port in step (h) is not equal to the data word.

8. The BISR circuit according to claim 7, wherein the locating steps further comprise the following steps before step (e):
 (a) setting the fixed column address;
 (b) setting all bits of the data word to 0;
 (c) writing the data word into memory cells at the fixed column address and row addresses FR−PA~FR+PB, wherein FR is the fault row address, and PA and PB are both predetermined integers;
 (d) setting the variable row address Addr=FR−PC, wherein PC is a predetermined integer;
 and the locating steps further comprise the following steps after step (j):
 (k) add 1 to the variable row address, repeating steps (e)~(k) if the variable row address is smaller than or equal to FR+PE, wherein PE is a predetermined integer; and
 (l) setting all bits of the data word to 1, repeating steps (c)~(k).

9. The BISR circuit according to claim 8, wherein PA, PB, and PC are all 2, and PD and PE are both 1.

10. The BISR circuit according to claim 6, wherein the DLM executes a plurality of locating steps to the repairable multi-port memory to generate the defect location if the port-specific fault candidate is corresponding to a bit line defect, the locating steps comprise:
 (c) writing a first word into a memory cell at column address Addr and a first row address through a first port of the repairable multi-port memory, and simultaneously writing the first word into a memory cell at column address Addr and a second row address through a second port of the repairable multi-port memory, wherein Addr is a variable column address;
 (d) writing a second word into a memory cell at column address Addr+PB and the first row address through the first port, and simultaneously writing the second word into a memory cell at column address Addr+PB and the second row address through the second port, wherein PB is a predetermined integer;
 (e) reading a memory cell at column address Addr and the first row address through the first port, and simultaneously reading a memory cell at column address Addr and the second row address through the second port;
 (f) the defect location comprising column addresses Addr and Addr+PB if the data read through the first port or the second port in step (e) is not equal to the first word;
 (g) writing the first word into a memory cell at column address Addr+PB and the first row address through the first port, and simultaneously writing the first word into a memory cell at column address Addr+PB and the second row address through the second port;
 (h) reading a memory cell at column address Addr and the first row address through the first port, and simultaneously reading a memory cell at column address Addr and the second row address through the second port; and
 (i) the defect location comprising column addresses Addr and Addr+PB if the data read through the first port or the second port in step (h) is not equal to the first word.

11. The BISR circuit according to claim 10, wherein the locating steps further comprise the following steps before step (c):
 (a) setting the first row address and the second row address;
 (b) setting the variable column address Addr=FC−PA, wherein FC is the fault column address, and PA is a predetermined integer;

and the locating steps further comprise the following steps after step (i):

(j) adding 1 to the variable column address, repeating steps (c)~(j) if the variable column address is smaller than or equal to the fault column address.

12. The BISR circuit according to claim 11, wherein the second row address is the first row address plus 1, all bits of the first word are 0, all bits of the second word are 1, and PA and PB are both 1.

13. A BISR method for a repairable multi-port memory, comprising:
testing the repairable multi-port memory to generate a fault location;
determining whether the test generates a port-specific fault candidate according to the fault location; and
generating a defect location based on the fault location and determining how to repair the repairable multi-port memory according to the defect location if the test generates a port-specific fault candidate.

14. The BISR method according to claim 13 further comprising:
determining how to repair the repairable multi-port memory according to the fault location if the test does not generate a port-specific fault candidate.

15. The BISR method according to claim 13, wherein the repairable multi-port memory is in sub-array configuration.

16. The BISR method according to claim 13 further comprising:
if the fault location comprises a plurality of continuous memory cells in the same row, determining that the test generates a port-specific fault candidate and the port-specific fault candidate is corresponding to a word line defect and providing the row address of the memory cells as a fault row address; and
if the fault location comprises a plurality of continuous memory cells in the same column, determining that the test generates a port-specific fault candidate and the port-specific fault candidate is corresponding to a bit line defect and providing the column address of the memory cells as a fault column address.

17. The BISR method according to claim 16, wherein if the port-specific fault candidate is corresponding to a word line defect, the BISR method further comprises the following steps executed to the repairable multi-port memory:

(e) writing the inverted value of a data word into a memory cell at a fixed column address and a variable row address;
(f) reading a memory cell at the fixed column address and row address Addr+PD through a first port of the repairable multi-port memory, and simultaneously reading a memory cell at the fixed column address and row address Addr+PD through a second port of the repairable multi-port memory, wherein Addr is the variable row address, and PD is a predetermined integer;
(g) the defect location comprising row addresses Addr and Addr+PD if the data read through the first port or the second port in step (f) is not equal to the data word;
(h) reading a memory cell at the fixed column address and row address Addr through the first port, and simultaneously reading a memory cell at the fixed column address and row address Addr+PD through the second port;
(i) the defect location comprising row address Addr+PD if the data read through the first port in step (h) is not equal to the inverted value of the data word; and
(j) the defect location comprising row address Addr if the data read through the second port in step (h) is not equal to the data word.

18. The BISR method according to claim 17, wherein the BISR method further comprises the following steps before step (e):

(a) setting the fixed column address;
(b) setting all bits of the data word to 0;
(c) writing the data word into memory cells at the fixed column address and row addresses FR−PA~FR+PB, wherein FR is the fault row address, and PA and PB are both predetermined integers;
(d) setting the variable row address Addr=FR−PC, wherein PC is a predetermined integer;

and the BISR method further comprises the following steps after step (j):

(k) adding 1 to the variable row address, repeating steps (e)~(k) if the variable row address is smaller than or equal to FR+PE, wherein PE is a predetermined integer; and
(l) setting all bits of the data word to 1, repeating steps (c)~(k).

19. The BISR method according to claim 16, wherein if the port-specific fault candidate is corresponding to a bit line defect, the BISR method further comprise the following steps executed to the repairable multi-port memory:

(c) writing a first word into a memory cell at column address Addr and a first row address through a first port of the repairable multi-port memory, and simultaneously writing the first word into a memory cell at column address Addr and a second row address through a second port of the repairable multi-port memory, wherein Addr is a variable column address;
(d) writing a second word into a memory cell at column address Addr+PB and the first row address through the first port, and simultaneously writing the second word into a memory cell at column address Addr+PB and the second row address through the second port, wherein PB is a predetermined integer;
(e) reading a memory cell at column address Addr and the first row address through the first port, and simultaneously reading a memory cell at column address Addr and the second row address through the second port;
(f) the defect location comprising column addresses Addr and Addr+PB if the data read through the first port or the second port in step (e) is not equal to the first word;
(g) writing the first word into a memory cell at column address Addr+PB and the first row address through the first port, and simultaneously writing the first word into a memory cell at column address Addr+PB and the second row address through the second port;
(h) reading a memory cell at column address Addr and the first row address through the first port, and simultaneously reading a memory cell at column address Addr and the second row address through the second port; and
(i) the defect location comprising column addresses Addr and Addr+PB if the data read through the first port or the second port in step (h) is not equal to the first word.

20. The BISR method according to claim 19, wherein the BISR method further comprises the following steps before step (c):

(a) setting the first row address and the second row address;
(b) setting the variable column address Addr=FC−PA, wherein FC is the fault column address, and PA is a predetermined integer;

and the BISR method further comprises the following steps after step (i):

(j) adding 1 to the variable column address, repeating steps (c)~(j) if the variable column address is smaller than or equal to the fault column address.

* * * * *